(12) United States Patent
Kubouchi et al.

(10) Patent No.: US 11,257,943 B2
(45) Date of Patent: Feb. 22, 2022

(54) SEMICONDUCTOR DEVICE

(71) Applicant: FUJI ELECTRIC CO., LTD., Kanagawa (JP)

(72) Inventors: Motoyoshi Kubouchi, Matsumoto (JP); Soichi Yoshida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/894,888

(22) Filed: Jun. 8, 2020

(65) Prior Publication Data
US 2020/0395440 A1 Dec. 17, 2020

(30) Foreign Application Priority Data

Jun. 17, 2019 (JP) .............................. JP2019-111786
May 19, 2020 (JP) .............................. JP2020-087471

(51) Int. Cl.
*H01L 29/78* (2006.01)
*H01L 27/07* (2006.01)
*H01L 29/06* (2006.01)

(52) U.S. Cl.
CPC ........ *H01L 29/7811* (2013.01); *H01L 27/075* (2013.01); *H01L 29/0619* (2013.01); *H01L 29/0623* (2013.01); *H01L 29/0696* (2013.01); *H01L 29/7823* (2013.01)

(58) Field of Classification Search
CPC ............. H01L 29/0619; H01L 29/0623; H01L 29/0696; H01L 29/075; H01L 29/66325; H01L 29/66333; H01L 29/7393; H01L 29/7395; H01L 29/7811; H01L 29/7823; H01L 2429/13055
See application file for complete search history.

(56) References Cited

U.S. PATENT DOCUMENTS

| 9,570,541 | B2 * | 2/2017 | Mizushima | ....... H01L 21/26513 |
| 10,204,979 | B2 | 2/2019 | Mizushima | |
| 2001/0005031 | A1 * | 6/2001 | Sakamoto | ........... H01L 29/7722 257/401 |
| 2006/0214221 | A1 * | 9/2006 | Challa | ............... H01L 29/66734 257/328 |

(Continued)

FOREIGN PATENT DOCUMENTS

| JP | H08167715 A | 6/1996 |
| JP | H10270370 A | 10/1998 |

(Continued)

*Primary Examiner* — Eduardo A Rodela

(57) ABSTRACT

A semiconductor device includes a semiconductor substrate having a drift region, and an edge terminal structure portion provided between the active region and an end portion of the semiconductor substrate on an upper surface of the semiconductor substrate. The edge terminal structure portion includes a plurality of guard rings of a second conductivity type which are in contact with the upper surface, and a high concentration region of the first conductivity type which has a higher doping concentration than the drift region and is provided, between adjacent two of the guard rings, from a position shallower than lower ends of the guard rings to a position deeper than the lower ends of the guard rings. Each of the guard rings has a region that is not covered by the high concentration region as viewed from a lower surface side.

17 Claims, 19 Drawing Sheets

(56) References Cited

U.S. PATENT DOCUMENTS

| | | | |
|---|---|---|---|
| 2009/0072340 A1* | 3/2009 | Zhang | H01L 29/0619 |
| | | | 257/490 |
| 2013/0037851 A1 | 2/2013 | Gejo | |
| 2013/0187256 A1* | 7/2013 | Shirai | H01L 29/6625 |
| | | | 257/565 |
| 2015/0214299 A1* | 7/2015 | Blanchard | H01L 29/732 |
| | | | 257/488 |
| 2016/0211194 A1* | 7/2016 | Hung | H01L 23/49816 |
| 2018/0040688 A1* | 2/2018 | Kobayashi | H01L 29/0878 |
| 2018/0151366 A1* | 5/2018 | Endo | H01L 29/1095 |
| 2018/0350961 A1 | 12/2018 | Naito | |

FOREIGN PATENT DOCUMENTS

| | | |
|---|---|---|
| JP | 2005252212 A | 9/2005 |
| JP | 2007266520 A | 10/2007 |
| JP | 2013038329 A | 2/2013 |
| WO | 2012081664 A1 | 6/2012 |
| WO | 2018030440 A1 | 2/2018 |
| WO | 2019181852 A1 | 9/2019 |

* cited by examiner

SEMICONDUCTOR DEVICE

The contents of the following Japanese patent application are incorporated herein by reference:
NO. 2019-111786 filed on Jun. 17, 2019.
NO. 2020-087471 filed on May 19, 2020.

BACKGROUND

1. Technical Field

The present invention relates to a semiconductor device.

2. Related Art

Up to now, a structure has been proposed where a P type guard ring is provided in an outer peripheral part of an N type semiconductor substrate on which a semiconductor device such as an insulated gate bipolar transistor (IGBT) is formed (for example, see Patent Literature 1).

Patent Literature 1: Japanese Unexamined Patent Application Publication No. 8-167715

An electric field may be intensified in the vicinity of a bottom portion of the guard ring in some cases.

SUMMARY

To address the above-described issue, according to an aspect of the present invention, there is provided a semiconductor device including a semiconductor substrate having a drift region of a first conductivity type. The semiconductor device may include an active region provided in the semiconductor substrate. The semiconductor device may include an edge terminal structure portion provided in the semiconductor substrate, and provided between the active region and an end portion of the semiconductor substrate on an upper surface of the semiconductor substrate. The edge terminal structure portion may have a plurality of the guard rings of a second conductivity type which are in contact with the upper surface of the semiconductor substrate. The edge terminal structure portion may have a high concentration region of the first conductivity type which is provided, between adjacent two of the guard rings, from a position shallower than lower ends of the guard rings to a position deeper than the lower ends of the guard rings, the high concentration region having a higher doping concentration than the drift region. Each of the guard rings may have a region that is not covered by the high concentration region as viewed from a lower surface side of the semiconductor substrate.

At least a part of a lower surface of each of the guard rings may be in contact with the drift region.

The high concentration region may be in contact with the upper surface of the semiconductor substrate.

The high concentration region may have an upper part in contact with the upper surface of the semiconductor substrate. The high concentration region may have a lower part that is provided as a separate part from the upper part, and is provided from the position shallower than the lower ends of the guard rings to the position deeper than the lower ends of the guard rings.

The upper part may contain a first dopant of the first conductivity type. The lower part may contain a second dopant of the first conductivity type which is made of an element different from the first dopant.

The second dopant may be hydrogen.

The active region may have a base region of the second conductivity type. The active region may have a well region of the second conductivity type which has a higher doping concentration than the base region, and is also provided from the upper surface of the semiconductor substrate to a position deeper than the base region. A doping concentration of the lower part may be lower than the doping concentration of the well region.

A lower end of the lower part may be arranged in a position shallower than a lower end of the well region.

An upper end of the high concentration region may be arranged to be lower than upper ends of the guard rings that are adjacent to each other.

The guard ring may be in contact with the upper surface of the semiconductor substrate.

The upper end of the high concentration region may be arranged to be lower than the upper surface of the semiconductor substrate.

The semiconductor device may include an interlayer dielectric film that covers the high concentration region.

The summary of the invention described above does not necessarily describe all necessary features of the embodiments of the present invention. The present invention may also be a sub-combination of the features described above.

DESCRIPTION OF EXEMPLARY EMBODIMENTS

Figure 1:
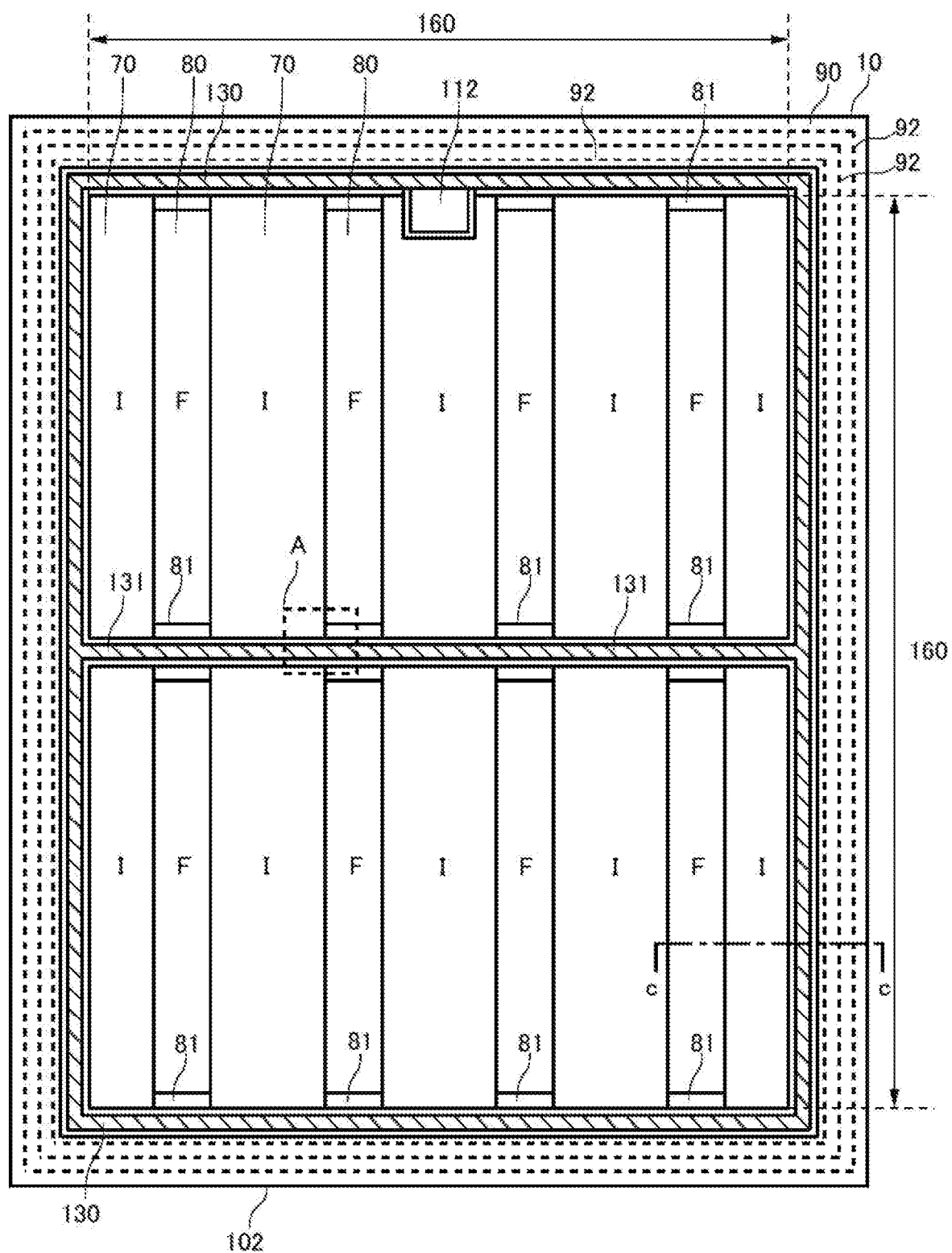
FIG. 1 is a top view illustrating an example of a semiconductor device 100 according to an embodiment of the present invention.

Hereinafter, the present invention will be described by way of embodiments of the invention, but the following embodiments are not intended to limit the invention according to the claims. In addition, not all combinations of features described in the embodiments necessarily have to be essential to solving means of the invention.

One side in a direction parallel to a depth direction of a semiconductor substrate is referred to as an "upper" side, and the other side is referred to as a "lower" side in the present specification. One surface out of two main surfaces of a substrate, a layer, or other members is referred to as an upper surface, and the other surface is referred to as a lower surface. The "upper" and "lower" directions are not limited to the gravitational direction or a direction at the time of mounting of a semiconductor device.

According to the present specification, technical matters may be described using orthogonal coordinate axes of an X axis, a Y axis and a Z axis in some cases. The orthogonal coordinate axes merely identify relative positions of components, and are not intended to limit particular directions. For example, the Z axis is not intended to solely represent a height direction to a ground surface. It is noted that a +Z axis direction and a −Z axis direction are in mutually opposite directions. In a case where a Z axis direction is stated without stating plus and minus, the Z axis direction means a direction in parallel with the +Z axis direction and the −Z axis direction.

According to the present specification, orthogonal axes in parallel with an upper surface and a lower surface of the semiconductor substrate are set as the X axis and the Y axis. In addition, an axis perpendicular to the upper surface and the lower surface of the semiconductor substrate is set as the Z axis. According to the present specification, the Z axis direction may be referred to as a depth direction in some cases. In addition, according to the present specification, including the X axis and the Y axis, a direction in parallel with the upper surface and the lower surface of the semiconductor substrate may be referred to as a horizontal direction in some cases.

In a case where a term "the same" or "equal" is described in the present specification, a case where an error derived from a production tolerance may also be included. The error is, for example, within 10%.

According to the present specification, descriptions are provided while a conductivity type of a doping region in which impurities are doped is set as a P type or an N type. According to the present specification, the impurities may particularly mean either an N type donor or a P type acceptor in some cases, and may be referred to as a dopant in some cases. According to the present specification, doping means that the donor or the acceptor is introduced to the semiconductor substrate to be transformed into a semiconductor showing an N type conductivity type or a P type conductivity type.

According to the present specification, a doping concentration means a donor concentration or an acceptor concentration in a thermal equilibrium state. According to the present specification, a net doping concentration means an added-up net concentration including charge polarities while the donor concentration is set as a positive ion concentration, and the acceptor concentration is set as a negative concentration. In one example, when the donor concentration is set as $N_D$, and the acceptor concentration is set as $N_A$, the net doping concentration that is a net concentration in any position is set as $N_D$-$N_A$.

The donor has a function for supplying electrons to a semiconductor. The acceptor has a function for receiving electrons from a semiconductor. The donor and the acceptor are not limited to the impurities themselves. For example, a VOH defect in which a vacancy (V), oxygen (O), and hydrogen (H) that are present in the semiconductor are combined functions as the donor for supplying electrons.

In a case where a P+ type or an N+ type is described in the present specification, it means that the doping concentration is higher than the P type or the N type, and in a case where a P− type or an N− type is described, it means that the doping concentration is lower than the P type or the N type. In addition, in a case where a P++ type or an N++ type is described in the present specification, it means that the doping concentration is higher than the P+ type or the N+ type.

A chemical concentration in the present specification refers to an impurity concentration that is measured irrespective of an electrical activation state. The chemical concentration can be measured by secondary ion mass spectrometry (SIMS), for example. The above-described net doping concentration can be measured by a voltage-capacitance measurement method (CV method). In addition, a carrier concentration measured by a spreading resistance profiling method (SRP method) may be set as the net doping concentration. The carrier concentration measured by the CV method or the SRP method may be set as a value in the thermal equilibrium state. In addition, since the donor concentration is sufficiently higher than the acceptor concentration in the N type region, the carrier concentration in this region may also be set as the donor concentration. Similarly, in the P type region, the carrier concentration in the region may also be set as the acceptor concentration.

In addition, in a case where a donor, acceptor, or net doping concentration distribution has a peak, the peak value may be set as the donor, acceptor, or net doping concentration in the region. In a case, for example, where as the donor, acceptor, or net doping concentration is substantially uniform, an average value of the donor, acceptor, or net doping concentration in the region may be set as the donor, acceptor, or net doping concentration.

The carrier concentration measured by the SRP method may also be lower than the donor or acceptor concentration. In a range where a current flows when a spreading resistance is measured, a carrier mobility of the semiconductor substrate may be lower than a value of a carrier mobility in a crystalline state in some cases. A reduction in the carrier mobility may occur when carriers scatter due to an interruption (disorder) of a crystalline structure caused by a lattice defect or the like.

The donor or acceptor concentration calculated from the carrier concentration measured by the CV method or the SRP method may be lower than a chemical concentration of an element showing the donor or acceptor. In one example, a donor concentration of phosphorus or arsenic serving as the donor in a silicon semiconductor or an acceptor concentration of boron serving as the acceptor is approximately 99% of these chemical concentrations. On the other hand, a donor concentration of hydrogen serving as the donor in the silicon semiconductor is approximately 0.1% to 10% of a chemical concentration of hydrogen.

FIG. 1 is a top view illustrating an example of a semiconductor device 100 according to an embodiment of the present invention. FIG. 1 illustrates positions obtained by projecting the respective members onto an upper surface of a semiconductor substrate 10. FIG. 1 illustrates only a part of members of the semiconductor device 100, and another part of the members are omitted.

The semiconductor device 100 includes the semiconductor substrate 10. The semiconductor substrate 10 has an end side 102 in a top view. In a case where the top view is simply mentioned in the present specification, it means viewing from an upper surface side of the semiconductor substrate 10. The semiconductor substrate 10 in this example has two pairs of the end sides 102 mutually facing in the top view. In FIG. 1, the X axis and the Y axis are in parallel with any of the end sides 102. In addition, the Z axis is perpendicular to the upper surface of + the semiconductor substrate 10.

An active portion 160 is provided in the semiconductor substrate 10. In a case where the semiconductor device 100 operates, the active portion 160 is a region where a main current flows in the depth direction between the upper surface and the lower surface of the semiconductor substrate 10. An emitter electrode is provided above the active portion 160, but is omitted in FIG. 1.

At least one of a transistor portion 70 including a transistor element such as an IGBT and a diode portion 80 including a diode element such as a freewheeling diode (FWD) is provided in the active portion 160. In the example of FIG. 1, the transistor portions 70 and the diode portions 80 are alternately arranged on the upper surface of the semiconductor substrate 10 in a predetermined array direction (X axis direction in this example). In another example, only one of the transistor portion 70 and the diode portion 80 may also be provided in the active portion 160.

In FIG. 1, a region where the transistor portion 70 is arranged is assigned with a sign "I", and a region where the diode portion 80 is arranged is assigned with a sign "F". According to the present specification, a direction perpendicular to the array direction in the top view may be referred to as an extending direction (Y axis direction in FIG. 1) in some cases. Each of the transistor portion 70 and the diode portion 80 may have a longitudinal side in the extending direction. In other words, a length of the transistor portion 70 in the Y axis direction is larger than a width in the X axis direction. Similarly, a length of the diode portion 80 in the Y axis direction is larger than a width in the X axis direction. The extending direction of the transistor portion 70 and the diode portion 80 may be the same as a longitudinal direction of each of trench portions which will be described below.

The diode portion 80 has an N+ type cathode region in the region in contact with the lower surface of the semiconductor substrate 10. According to the present specification, the region where the cathode region is provided is referred to as the diode portion 80. In other words, the diode portion 80 is a region overlapped with the cathode region in the top view. On the lower surface of the semiconductor substrate 10, a P+ type collector region may be provided in a region other than the cathode region. According to the present specification, an extended region 81 obtained by extending the diode portion 80 in the Y axis direction up to a gate runner which will be described below may be included in the diode portion 80 too in some cases. The collector region is provided on a lower surface of the extended region 81.

The transistor portion 70 has the P+ type collector region in the region in contact with the lower surface of the semiconductor substrate 10. In addition, in the transistor portion 70, gate structures each including an N type emitter region, a P type base region, a gate conductive portion, and a gate dielectric film are periodically arranged on the upper surface side of the semiconductor substrate 10.

The semiconductor device 100 may have one or more pads above the semiconductor substrate 10. The semiconductor device 100 in this example has a gate pad 112. The semiconductor device 100 may also have pads such as an anode pad, a cathode pad, and a current detection pad. Each pad is arranged in the vicinity of the end side 102. The region in the vicinity of the end side 102 refers to a region between the end side 102 and the emitter electrode in the top view. At the time of mounting of the semiconductor device 100, each pad may be connected to an external circuit via a wiring such as a wire.

The gate pad 112 is applied with a gate potential. The gate pad 112 is electrically connected to a conductive portion of a gate trench portion in the active portion 160. The semiconductor device 100 includes a gate runner that connects the gate pad 112 to the gate trench portion. In FIG. 1, diagonal hatching is applied to the gate runner.

The gate runner in this example has an outer peripheral gate runner 130 and an active-side gate runner 131. The outer peripheral gate runner 130 is arranged between the active portion 160 and the end side 102 of the semiconductor substrate 10 in the top view. The outer peripheral gate runner 130 in this example surrounds the active portion 160 in the top view. A region surrounded by the outer peripheral gate runner 130 in the top view may also be set as the active portion 160. In addition, the outer peripheral gate runner 130 is connected to the gate pad 112. The outer peripheral gate runner 130 is arranged above the semiconductor substrate 10. The outer peripheral gate runner 130 may be a metallic wiring including aluminum or the like.

The active-side gate runner 131 is provided in the active portion 160. When the active-side gate runner 131 is provided in the active portion 160, with regard to each region of the semiconductor substrate 10, it is possible to suppress a fluctuation of a wiring length from the gate pad 112.

The active-side gate runner 131 is connected to the gate trench portion in the active portion 160. The active-side gate runner 131 is arranged above the semiconductor substrate 10. The active-side gate runner 131 may be a wiring formed of a semiconductor such as polysilicon in which impurities are doped.

The active-side gate runner 131 may be connected to the outer peripheral gate runner 130. The active-side gate runner 131 in this example is provided extending in the X axis direction to transverse the active portion 160 from the outer peripheral gate runner 130 on one side to the outer peripheral gate runner 130 on the other side substantially in the center in the Y axis direction. In a case where the active portion 160 is divided by the active-side gate runner 131, the transistor portions 70 and the diode portions 80 may be alternately arranged in each of the divided regions in the X axis direction.

In addition, the semiconductor device 100 may also include a temperature sensing unit that is not illustrated in the drawing and serves as a PN junction diode formed of polysilicon or the like, and a current detection unit that is not illustrated in the drawing and configured to simulate an operation of the transistor portion included in the active portion 160.

The semiconductor device 100 in this example includes an edge terminal structure portion 90 between the active portion 160 and the end side 102. The edge terminal structure portion 90 in this example is arranged between the outer peripheral gate runner 130 and the end side 102. The edge terminal structure portion 90 mitigates an electric field concentration on an upper surface side of the semiconductor substrate 10. The edge terminal structure portion 90 includes a plurality of guard rings 92. Each of the guard rings 92 is a P type region in contact with the upper surface of the semiconductor substrate 10. The guard ring 92 may surround the active portion 160 in the top view. The plurality of guard rings 92 are arranged at a predetermined interval between the outer peripheral gate runner 130 and the end side 102. The guard ring 92 arranged on an outer side may surround the guard ring 92 arranged on an inner side next to the outer side. The outer side refers to a side close to the end side 102, and the inner side refers to a side close to the outer peripheral gate runner 130. When the plurality of guard rings 92 are provided, a depletion layer on an upper surface side of the active portion 160 can extend onto the outer side, and it is possible to improve a breakdown voltage of the semiconductor device 100. The edge terminal structure portion 90 may also further include at least one of a field plate and a RESURF annularly provided to surround the active portion 160.

Figure 2:
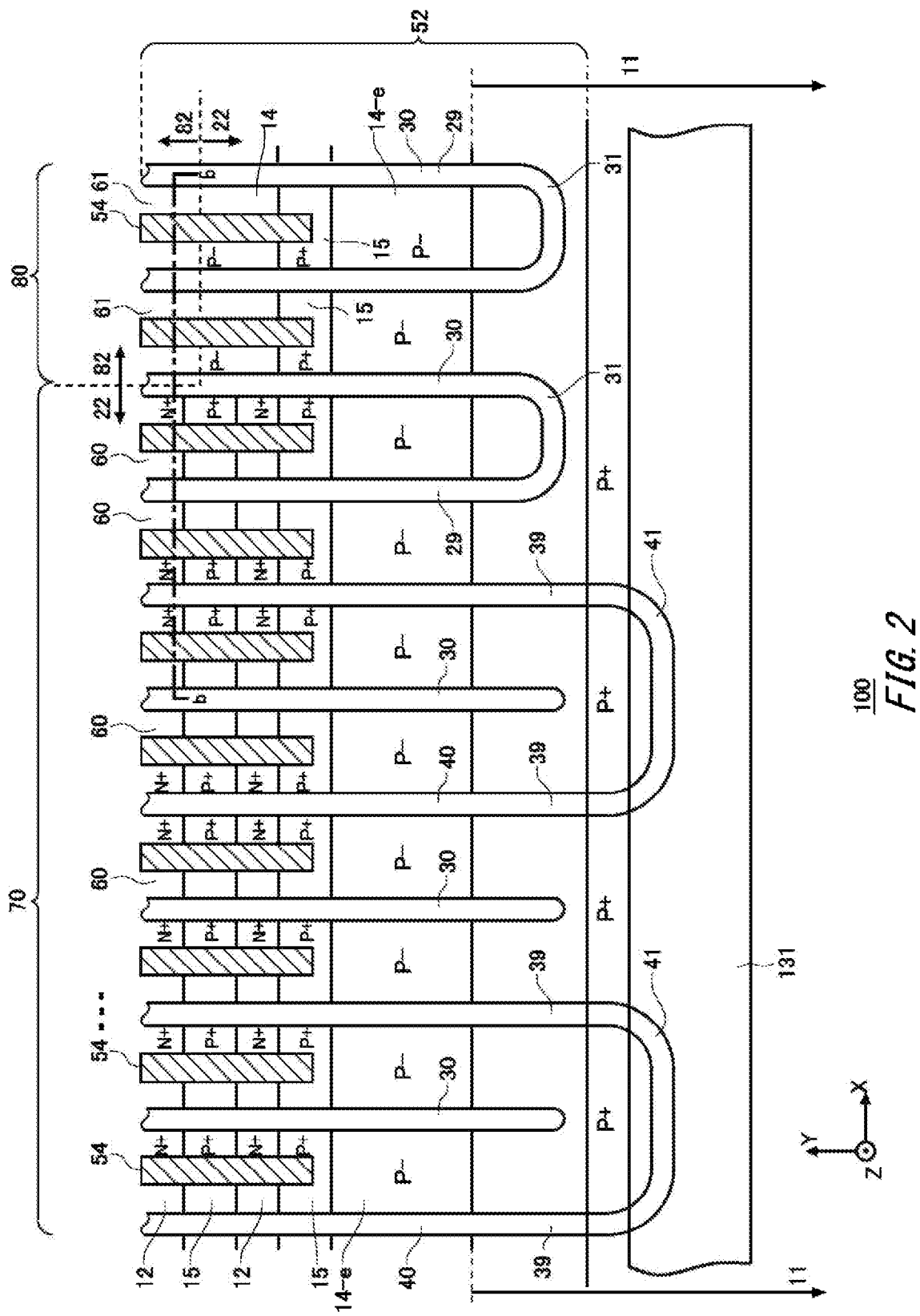
FIG. 2 is an enlarged view of a region A in FIG. 1.

FIG. 2 is an enlarged view of a region A in FIG. 1. The region A is a region including the transistor portion 70, the diode portion 80, and the active-side gate runner 131. The semiconductor device 100 in this example includes a gate trench portion 40, a dummy trench portion 30, a well region 11, an emitter region 12, a base region 14, and a contact region 15 that are provided inside the semiconductor substrate 10 on the upper surface side. Each of the gate trench portion 40 and the dummy trench portion 30 is an example of a trench portion. In addition, the semiconductor device 100 in this example includes an emitter electrode 52 and an active-side gate runner 131 that are provided above the upper surface of the semiconductor substrate 10. The emitter electrode 52 and the active-side gate runner 131 are provided while being separated from each other.

An interlayer dielectric film is provided between the emitter electrode 52 and the active-side gate runner 131 and the upper surface of the semiconductor substrate 10, but is omitted in FIG. 1. In the interlayer dielectric film in this example, a contact hole 54 is provided penetrating through an interlayer dielectric film. In FIG. 2, diagonal hatching is applied to each of the contact holes 54.

The emitter electrode 52 is provided above the gate trench portion 40, the dummy trench portion 30, the well region 11, the emitter region 12, the base region 14, and the contact region 15. The emitter electrode 52 passes through the contact hole 54, and comes into contact with the emitter region 12, the contact region 15, and the base region 14 on the upper surface of the semiconductor substrate 10. In addition, the emitter electrode 52 passes through the contact hole provided in the interlayer dielectric film, and is connected to a dummy conductive portion in the dummy trench portion 30. The emitter electrode 52 may be connected to the dummy conductive portion of the dummy trench portion 30 at a distal end of the dummy trench portion 30 in the Y axis direction.

The active-side gate runner 131 passes through the contact hole provided in the interlayer dielectric film, and comes into contact with the gate trench portion 40. The active-side gate runner 131 may be connected to a gate conductive portion of the gate trench portion 40 at a distal end portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 illustrates a range where the emitter electrode 52 is provided. For example, a region of at least a part of the emitter electrode 52 is formed of aluminum or an aluminum-silicon alloy including, for example, a metallic alloy such as AlSi or AlSiCu. The emitter electrode 52 may have a barrier metal formed of titanium, a titanium compound, or the like in a lower layer of the region formed of aluminum or the like. Furthermore, the contact hole may also have therein a plug formed by implanting tungsten or the like to come into contact with the barrier metal, aluminum, and the like.

The well region 11 is provided while being overlapped with the active-side gate runner 131. The well region 11 is also provided extending at a predetermined width in a range without being overlapped with the active-side gate runner 131. The well region 11 in this example is provided while being away from an end of the contact hole 54 in the Y axis direction towards the active-side gate runner 131 side. The well region 11 is a second conductivity type region where the doping concentration is higher than the base region 14. The base region 14 in this example is of the P− type, and the well region 11 is of the P+ type.

Each of the transistor portion 70 and the diode portion 80 has a plurality of trench portions arrayed in the array direction. In the transistor portion 70 in this example, one or more of the gate trench portions 40 and one or more of the dummy trench portions 30 are alternately provided along the array direction. In the diode portion 80 in this example, the plurality of dummy trench portions 30 are provided along the array direction. The gate trench portion 40 is not provided in the diode portion 80 in this example.

The gate trench portion 40 in this example may include two linear parts 39 (trench parts that are linear along the extending direction) extending along the extending direction perpendicular to the array direction, and the distal end portion 41 that connects the two linear parts 39. The extending direction in FIG. 2 is the Y axis direction.

At least a part of the distal end portion 41 is preferably provided to be curved in the top view. When the distal end portion 41 connects mutual end portions of the two linear parts 39 in the Y axis direction, it is possible to mitigate the electric field concentrations at the end portions of the linear parts 39.

In the transistor portion 70, the dummy trench portion 30 is provided between the respective linear parts 39 of the gate trench portions 40. Between the respective linear parts 39, one piece of the dummy trench portion 30 may be provided, or plural pieces of the dummy trench portions 30 may also be provided. The dummy trench portion 30 may have a linear shape extending in the extending direction, and may also have linear parts 29 and a distal end portion 31 similarly as in the gate trench portion 40. The semiconductor device 100 illustrated in FIG. 2 includes both the dummy trench portion 30 having the linear shape without including the distal end portion 31, and the dummy trench portion 30 including the distal end portion 31.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top view. In other words, in the end portion of each trench portion in the Y axis direction, a bottom portion of each trench portion in the depth direction is covered with the well region 11. Thus, the electric field concentration in the bottom portion in each trench portion can be mitigated.

A mesa portion is provided between each of the trench portions in the array direction. The mesa portion refers to a region sandwiched by the trench portions inside the semiconductor substrate 10. In one example, an upper end of the mesa portion is the upper surface of the semiconductor substrate 10. A depth position at a lower end of the mesa portion is the same as a depth position at a lower end of the trench portion. The mesa portion in this example is provided extending on the upper surface of the semiconductor substrate 10 in the extending direction (Y axis direction) along the trench. In this example, a mesa portion 60 is provided in the transistor portion 70, and a mesa portion 61 is provided in the diode portion 80. In a case where the mesa portion is simply mentioned in the present specification, the mesa portion refers to each of the mesa portion 60 and the mesa portion 61.

The base region 14 is provided in each mesa portion. Among the base regions 14 exposed on the upper surface of the semiconductor substrate 10 in the mesa portion, the region arranged to be the closest to the active-side gate runner 131 is set as a base region 14-e. FIG. 2 illustrates the base region 14-e arranged in one end portion of each mesa portion in the extending direction, but the base region 14-e is also arranged in the other end portion of each mesa portion. In each of the mesa portions, in a region sandwiched by the base regions 14-e in the top view, at least one of the first conductivity type emitter region 12 and the second conductivity type contact region 15 may be provided. The emitter region 12 in this example is of the N+ type, and the contact region 15 is of the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The contact region 15 exposed on the upper surface of the semiconductor substrate 10 may be provided in the mesa portion 60 in contact with the gate trench portion 40.

Each of the contact region 15 and the emitter region 12 in the mesa portion 60 is provided from one trench portion to the other trench portion in the X axis direction. In one example, the contact region 15 and the emitter region 12 of the mesa portion 60 are alternately arranged along the extending direction of the trench portion (Y axis direction).

In another example, the contact region 15 and the emitter region 12 of the mesa portion 60 may also be provided in stripes along the extending direction of the trench portion (Y axis direction). For example, the emitter region 12 is provided in a region in contact with the trench portion, and the contact region 15 is provided in a region sandwiched by the two emitter regions 12 respectively in contact with adjacent trench portions.

The emitter region 12 is not provided in the mesa portion 61 of the diode portion 80. The base region 14 and the contact region 15 may be provided on an upper surface of the mesa portion 61. In a region sandwiched by the base regions 14-e on the upper surface of the mesa portion 61, the contact region 15 may be provided in contact with each of the base regions 14-e. The base region 14 may be provided in a region sandwiched by the contact regions 15 on the upper surface of the mesa portion 61. The base region 14 may be arranged in an entire region sandwiched by the contact regions 15.

The contact hole 54 is provided above each of the mesa portions. The contact hole 54 is arranged in a region sandwiched by the base regions 14-e. The contact hole 54 in this example is provided above each of the regions including the contact region 15, the base region 14, and the emitter region 12. The contact hole 54 is not provided in regions corresponding to the base region 14-e and the well region 11. The contact hole 54 may be provided in a center in the array direction of the mesa portions 60 (X axis direction).

In the diode portion 80, in a region adjacent to the lower surface of the semiconductor substrate 10, an N+ type cathode region 82 is provided. A P+ type collector region 22 may be provided on the lower surface of the semiconductor substrate 10 in a region where the cathode region 82 is not provided. In FIG. 2, a boundary between the cathode region 82 and the collector region 22 is represented by a dotted line.

The cathode region 82 is arranged to be away from the well region 11 in the Y axis direction. Thus, a distance between the P type region (the well region 11) that has a relatively high doping concentration and is also formed up to a deep position and the cathode region 82 is ensured, and the breakdown voltage can be improved. An end portion of the cathode region 82 in the Y axis direction in this example is arranged to be farther away from the well region 11 than an end portion of the contact hole 54 in the Y axis direction. In another example, the end portion of the cathode region 82 in the Y axis direction may also be arranged between the well region 11 and the contact hole 54.

Figure 3:
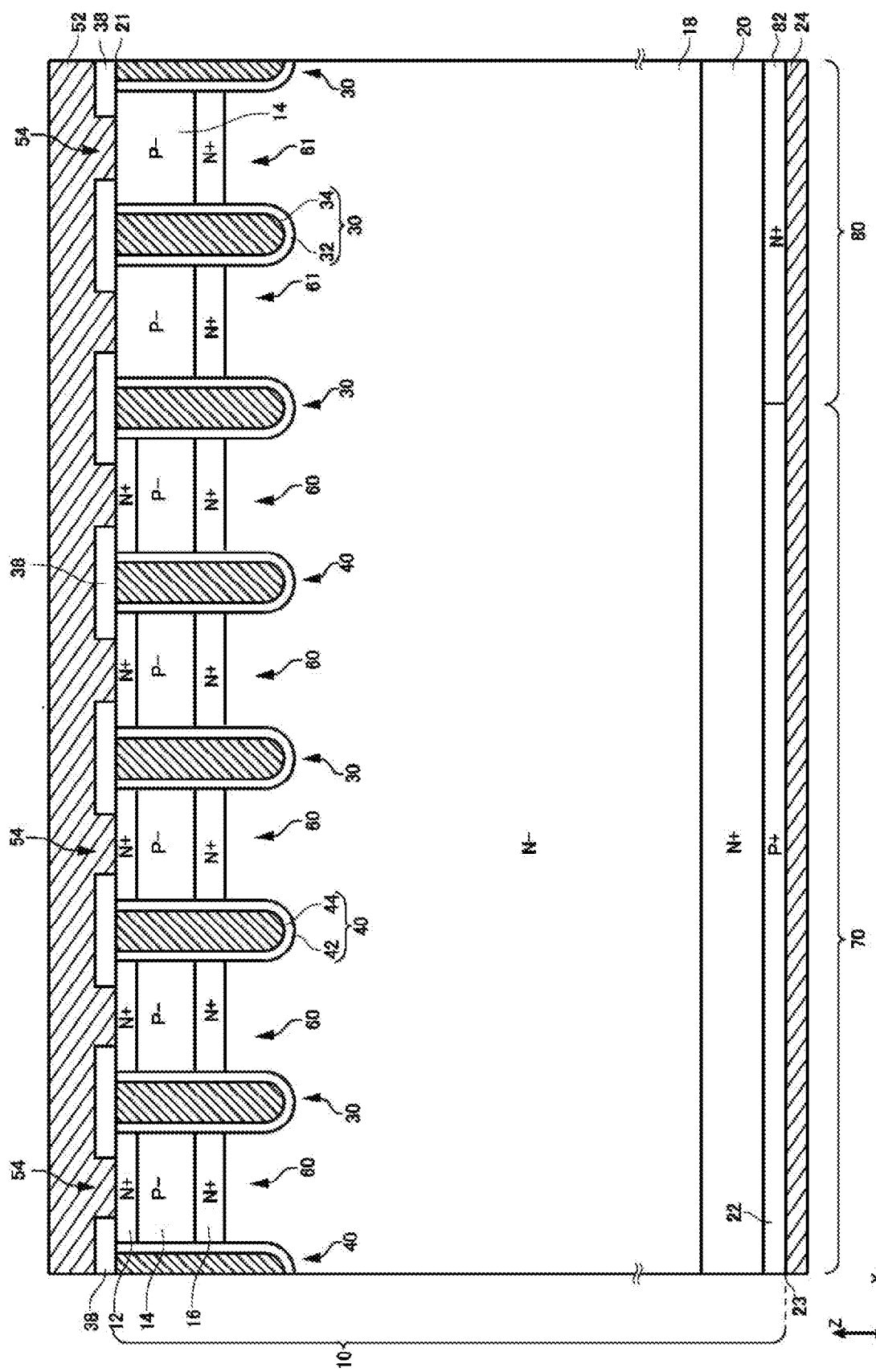
FIG. 3 is a drawing illustrating an example of a cross section taken along b-b in FIG. 2.

FIG. 3 is a drawing illustrating an example of a cross section taken along b-b in FIG. 2. A cross section taken along b-b is an XZ plane passing through the emitter region 12 and the cathode region 82. The semiconductor device 100 in this example has the semiconductor substrate 10, an interlayer dielectric film 38, the emitter electrode 52, and a collector electrode 24 in the cross section. The interlayer dielectric film 38 is provided on the upper surface of the semiconductor substrate 10. The interlayer dielectric film 38 is a film including at least one layer of a dielectric film made of silicate glass or the like to which impurities such as boron or phosphorus are doped, a thermally-oxidized film, and other dielectric films. The contact hole 54 described with reference to FIG. 2 is provided in the interlayer dielectric film 38.

The emitter electrode 52 is provided above the interlayer dielectric film 38. The emitter electrode 52 passes through the contact hole 54 of the interlayer dielectric film 38, and comes into contact with an upper surface 21 of the semiconductor substrate 10. The collector electrode 24 is provided on a lower surface 23 of the semiconductor substrate 10. The emitter electrode 52 and the collector electrode 24 are formed of a metallic material such as aluminum. According to the present specification, a direction that links the emitter electrode 52 and the collector electrode 24 (Z axis direction) is referred to as a depth direction.

The semiconductor substrate 10 has an N-type drift region 18. The drift region 18 is provided in each of the transistor portion 70 and the diode portion 80.

In the mesa portion 60 of the transistor portion 70, the N+ type emitter region 12 and the P− type base region 14 are provided in the stated order from the upper surface 21 side of the semiconductor substrate 10. The drift region 18 is provided below the base region 14. An N+ type accumulation region 16 may be provided in the mesa portion 60. The accumulation region 16 is arranged between the base region 14 and the drift region 18.

The emitter region 12 is exposed on the upper surface 21 of the semiconductor substrate 10, and also provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 in this example is provided in contact with the emitter region 12. The base region 14 may be in contact with the trench portions on both sides of the mesa portion 60.

The accumulation region 16 is provided below the base region 14. The accumulation region 16 is an N+ type region where the doping concentration is higher than the drift region 18. When the high concentration accumulation region 16 is provided between the drift region 18 and the base region 14, a carrier injection enhancement effect (IE effect) is increased, and an on-voltage can be reduced. The accumulation region 16 may be provided so as to cover the entire lower surface of the base region 14 in each of the mesa portions 60.

In the mesa portion 61 of the diode portion 80, the P− type base region 14 is provided in contact with the upper surface 21 of the semiconductor substrate 10. The drift region 18 is provided below the base region 14. In the mesa portion 61, the accumulation region 16 may also be provided below the base region 14.

In each of the transistor portion 70 and the diode portion 80, an N+ type buffer region 20 may be provided under the drift region 18. A doping concentration of the buffer region 20 is higher than the doping concentration of the drift region 18. The buffer region 20 has one or a plurality of donor concentration peaks where the donor concentration is higher than the drift region 18. The plurality of donor concentration peaks are arranged at different positions in the depth direction of the semiconductor substrate 10. The donor concentration peak of the buffer region 20 may be a concentration peak of hydrogen (protons) or phosphorus, for example. The buffer region 20 may function as a field stop layer that avoids a situation where the depletion layer spreading from a lower end of the base region 14 reaches the P+ type collector region 22 and the N+ type cathode region 82.

In the transistor portion 70, the P+ type collector region 22 is provided under the buffer region 20. An acceptor concentration of the collector region 22 is higher than an acceptor concentration of the base region 14. The collector region 22 may contain the same acceptor as that of the base region 14, or may also contain a different acceptor. The acceptor of the collector region 22 is boron, for example.

In the diode portion 80, the N+ type cathode region 82 is provided under the buffer region 20. A donor concentration of the cathode region 82 is higher than the drift region 18. A donor of the cathode region 82 is, for example, hydrogen or phosphorus. It is noted that the elements serving as the donor and the acceptor in each region are not limited to the above-described examples. The collector region 22 and the cathode region 82 are exposed on a lower surface 23 of the semiconductor substrate 10, and connected to the collector electrode 24. The collector electrode 24 may be in contact with the entire lower surface 23 of the semiconductor substrate 10. The emitter electrode 52 and the collector electrode 24 are formed of a metallic material such as aluminum.

One or more of the gate trench portions 40 and one or more of the dummy trench portions 30 are provided on the upper surface 21 side of the semiconductor substrate 10. Each trench portion penetrates through the base region 14 from the upper surface 21 of the semiconductor substrate 10, and reaches the drift region 18. In a region where at least any of the emitter region 12, the contact region 15, and the accumulation region 16 is provided, each trench portion also penetrates through these doping regions, and reaches the drift region 18. The penetration of the trench portions through the doping regions is not limited to such a fabrication that after the doping regions are formed, the trench portions are formed in the stated order. Such a fabrication that after the trench portions are formed, the doping regions are formed between the trench portions is also included in the penetration of the trench portions through the doping regions.

As described above, the gate trench portion 40 and the dummy trench portion 30 are provided in the transistor portion 70. In the diode portion 80, the dummy trench portion 30 is provided, and the gate trench portion 40 is not provided. A boundary between the diode portion 80 and the transistor portion 70 in the X axis direction in this example is the boundary between the cathode region 82 and the collector region 22.

The gate trench portion 40 has a gate trench, a gate dielectric film 42, and a gate conductive portion 44 that are provided on the upper surface 21 of the semiconductor substrate 10. The gate dielectric film 42 is provided to cover the inner wall of the gate trench. The gate dielectric film 42 may be formed by oxidizing or nitriding the semiconductor on the inner wall of the gate trench. The gate conductive portion 44 is provided inside the gate trench on an inner side relative to the gate dielectric film 42. In other words, the gate dielectric film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When the gate conductive portion 44 is applied with a predetermined gate voltage, a channel based on an electron inversion layer is formed on a front layer of a boundary face in contact with the gate trench portion 40 in the base region 14.

The dummy trench portion 30 may have the same structure as the gate trench portion 40 in the cross section. The dummy trench portion 30 has a dummy trench, a dummy dielectric film 32, and a dummy conductive portion 34 that are provided on the upper surface 21 of the semiconductor substrate 10. The dummy conductive portion 34 is electrically connected to the emitter electrode 52. The dummy dielectric film 32 is provided to cover an inner wall of the dummy trench. The dummy conductive portion 34 is provided inside the dummy trench, and also provided on an inner side relative to the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 in this example are covered by the interlayer dielectric film 38 on the upper surface 21 of the semiconductor substrate 10. It is noted that bottom portions of the dummy trench portion 30 and the gate trench portion 40 may have a curved surface shape that is convex downward (curved line shape in the cross section).

Figure 4:
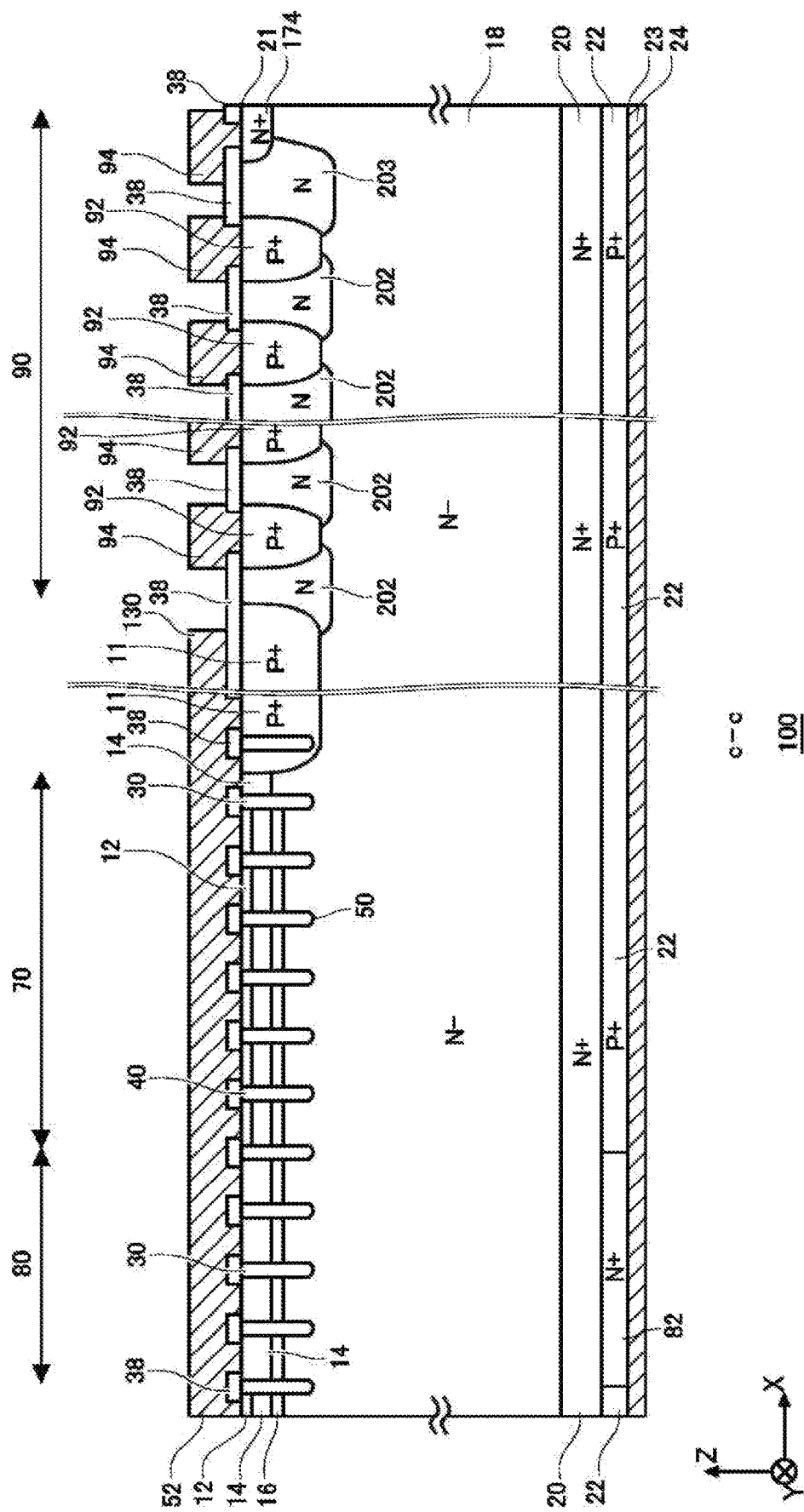
FIG. 4 is a drawing illustrating an example of a cross section taken along c-c in FIG. 1.

FIG. 4 is a drawing illustrating an example of a cross section taken along c-c in FIG. 1. A cross section taken along c-c is an XZ plane passing through the edge terminal structure portion 90, the transistor portion 70, and the diode portion 80. Structures of the transistor portion 70 and the diode portion 80 are the same as the transistor portion 70 and the diode portion 80 described with reference to FIG. 2 and FIG. 3. FIG. 4 illustrates simplified structures of the gate trench portion 40 and the dummy trench portion 30.

In the semiconductor substrate 10, the well region 11 is provided between the edge terminal structure portion 90 and the transistor portion 70. The well region 11 is a P+ type region in contact with the upper surface 21 of the semiconductor substrate 10. The well region 11 may be provided up to a position deeper than lower ends of the gate trench portion 40 and the dummy trench portion 30. A part of the gate trench portion 40 and the dummy trench portion 30 may be arranged inside the well region 11.

The interlayer dielectric film 38 that covers the well region 11 may be provided on the upper surface 21 of the semiconductor substrate 10. An electrode and a wiring such as the emitter electrode 52 and the outer peripheral gate runner 130 are provided above the interlayer dielectric film 38. The emitter electrode 52 is provided extending from a position above the active portion 160 to a position above the well region 11. The emitter electrode 52 may be connected to the well region 11 via a contact hole provided in the interlayer dielectric film 38.

The outer peripheral gate runner 130 is arranged between the emitter electrode 52 and the edge terminal structure portion 90. The emitter electrode 52 and the outer peripheral gate runner 130 are arranged to be separated from each other, but in FIG. 4, a gap between the emitter electrode 52 and the outer peripheral gate runner 130 is omitted. The outer peripheral gate runner 130 is electrically insulated from the well region 11 by the interlayer dielectric film 38.

The plurality of guard rings 92, a plurality of high concentration regions 202, a plurality of field plates 94, and a channel stopper 174 are provided in the edge terminal structure portion 90. In the edge terminal structure portion 90, the collector region 22 may be provided in a region in contact with the lower surface 23. Each of the guard rings 92 may be provided so as to surround the active portion 160 on the upper surface 21. The plurality of guard rings 92 may have a function for spreading the depletion layer generated in the active portion 160 to the outside of the semiconductor substrate 10. Thus, the electric field concentration inside the semiconductor substrate 10 can be avoided, and it is possible to improve the breakdown voltage of the semiconductor device 100.

The guard ring 92 in this example is a P+ type semiconductor region formed by the ion implantation in the vicinity of the upper surface 21. A depth of a bottom portion of the guard ring 92 may be deeper than depths of bottom portions of the gate trench portion 40 and the dummy trench portion 30. The depth of the bottom portion of the guard ring 92 may be same as, or may also be different from, a depth of a bottom portion of the well region 11.

An upper surface of the guard ring 92 is covered by the interlayer dielectric film 38. The field plate 94 is formed of a metal such as aluminum or a conductive material such as polysilicon. The field plate 94 may also be formed of an aluminum-silicon alloy including, for example, a metallic alloy such as AlSi or AlSiCu. The field plate 94 may be formed of the same material as the outer peripheral gate runner 130 or the emitter electrode 52. The field plate 94 is provided on the interlayer dielectric film 38. The field plate 94 in this example is connected to the guard ring 92 via a through-hole provided in the interlayer dielectric film 38.

The channel stopper 174 is provided to be exposed on the upper surface 21 and the side wall in the vicinity of the end side 102 of the semiconductor substrate 10. The channel stopper 174 is an N type region where a doping concentration is higher than the drift region 18. The channel stopper 174 has a function of terminating the depletion layer generated in the active portion 160 in the vicinity of the end side 102 of the semiconductor substrate 10. It is noted that, although FIG. 4 shows that the transistor portion 70, the diode portion 80, the edge terminal structure portion 90 have the interlayer dielectric film 38 with the same thickness, the thickness may be different, and the forming process may be different and the composition may be different. It is noted that at least a part of the field plate 94, the outer peripheral gate runner 130, and the emitter electrode 52 is covered by a protective film such as a polyimide or nitride film, but the protective film may be omitted in the drawings of the present specification in some cases.

Each of the high concentration regions 202 is an N type region where the doping concentration is higher than the drift region 18. The high concentration region 202 is provided, between the adjacent two guard rings 92, from a position shallower than the lower ends of the guard rings 92 to a position deeper than the lower ends of the guard rings 92. The high concentration region 202 may be provided between the well region 11 and the guard ring 92 too. The high concentration region 202 may be provided up to a position deeper than the lower end of the well region 11.

The high concentration region 203 is arranged between the guard ring 92 closest to the channel stopper 174 and the channel stopper 174. The high concentration region 203 may the same structure and doping concentration distribution as the high concentration region 202. In another example, the high concentration region 203 may be provided in a depth position different from that of the high concentration region 202. The high concentration region 203 may be provided up to a position shallower than the lower end of the high concentration region 202, or may also be provided up to a position deeper than the lower end of the high concentration region 202. The high concentration region 203 in this example is provided from the upper surface 21 of the semiconductor substrate 10 up to a position deeper than the lower end of the guard ring 92.

In addition, the doping concentration of the high concentration region 203 may be higher than the high concentration region 202, or may also be lower than the high concentration region 202. Thereby, it is possible to alleviate an electric field concentration between the guard ring 92 arranged on the outermost side and the channel stopper 174.

Figure 5:
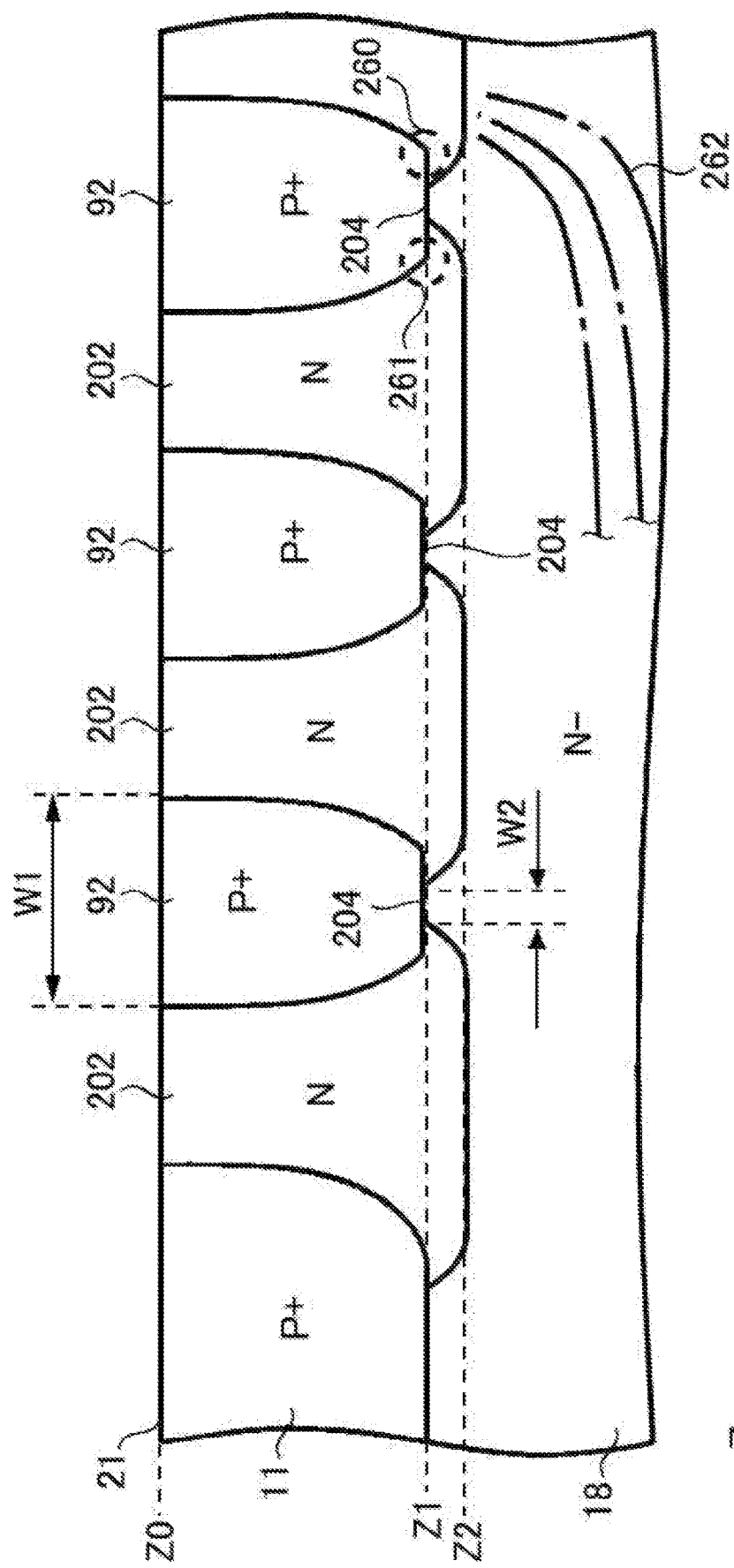
FIG. 5 is an enlarged view of a semiconductor substrate 10 in the vicinity of a well region 11 and guard rings 92 in FIG. 4.

FIG. 5 is an enlarged view of the semiconductor substrate 10 in the vicinity of the well region 11 and the guard rings 92 in FIG. 4. In this example, a position of the lower end of the guard ring 92 in the Z axis direction is set as Z1.

The high concentration region 202 has a region arranged on the upper surface 21 side relative to the position Z1, and a region arranged on the lower surface 23 side relative to the position Z1. The high concentration region 202 in this example is continuously provided from a position Z0 in contact with the upper surface 21 of the semiconductor substrate 10 to a depth position Z2. The position Z2 is a position farther away from the upper surface 21 than the position Z1.

The high concentration region 202 in this example covers a part of the guard ring 92 as viewed from the lower surface 23 side of the semiconductor substrate 10. In other words, a part of the high concentration region 202 is overlapped with a part of the guard ring 92 in the Z axis direction. The region provided from the depth positions Z1 to Z2 may cover a part of the guard ring 92 in the high concentration region 202. Thus, it is possible to mitigate the electric field concentration in the vicinity of the lower end of the guard ring 92, and also the spread of the depletion layer can be suppressed.

FIG. 5 schematically illustrates an equipotential line 262. As illustrated in FIG. 5, the electric field may concentrate in the vicinity of a lower region 260 of the guard ring 92. The lower region 260 may be a region where a curvature of a boundary line between the guard ring 92 and an N region become the highest. The lower region 260 may also be a region where a change of an inclination of the boundary line between the guard ring 92 and the N region (that is, a second order differential value) becomes the highest. The lower region 260 may be arranged in the vicinity of the lower end of the guard ring 92. The lower end of the guard ring 92 is a part arranged in the deepest position in the guard ring 92.

It is noted that the guard ring 92 may also have the lower region 260 and a lower region 261. In a case where a cross sectional shape of the guard ring 92 is axisymmetric to a center line in parallel with the Z axis, the guard ring 92 has the lower region 260 and the lower region 261 in axisymmetric positions. The lower region closer to the well region 11 out of the two lower regions 260 is set as the lower region 261, and the lower region farther from the well region 11 is set as the lower region 260. As illustrated in FIG. 5, the electric field tends to concentrate in the vicinity of the lower region 260.

When the high concentration region 202 is provided, it is possible to arrange a high concentration N type region in the vicinity of the lower region 260 and the lower region 261. Thus, the electric field concentrations in the vicinity of the lower region 260 and the lower region 261 can be mitigated, and also the spread of the depletion layer can be suppressed. The high concentration region 202 preferably covers the lower region 260. In other words, the high concentration region 202 is preferably in contact with the lower region 260. The high concentration region 202 may also further cover the lower region 261. A cross sectional shape of the high concentration region 202 may be axisymmetric to the center line in parallel with the Z axis.

In addition, since the electric field concentrates between the guard rings 92 and in a region in the vicinity of the lower end of the guard ring 92, when a fluctuation of the donor concentration in the region occurs, a fluctuation of the breakdown voltage occurs. In a case where the high concentration region 202 is not provided, the drift region 18 is formed in the region. Since the donor concentration in the drift region 18 is the concentration of the donor contained since the fabrication time of the semiconductor substrate 10, the fluctuation relatively easily occurs. In contrast, in this example, the high concentration region 202 is provided in the region. The high concentration region 202 is formed by the ion implantation or the like. Since the concentration of the ion implantation is relatively easily controlled, the donor concentration fluctuation of the high concentration region 202 is relatively low. For this reason, when the high concentration region 202 is provided, the breakdown voltage fluctuation of the semiconductor device 100 can be reduced too.

The high concentration region 202 is provided in at least one of regions sandwiched by the guard rings 92. The high concentration region 202 may also be arranged in all the regions sandwiched by the guard rings 92.

Each of the guard rings 92 has a region 204 that is not covered by the high concentration region 202 as viewed from the lower surface 23 side of the semiconductor substrate 10. The region 204 may be a region including the lower end in the center of the guard ring 92 in the X axis direction. The region 204 may be in contact with the drift region 18. In a case where all of the guard rings 92 at the high concentration are covered by the high concentration region 202, an electric field strength is also increased on a bottom surface of each of the guard rings 92. For this reason, the electric field strength easily reaches a critical electric field strength at a relatively low voltage, and avalanche breakdown occurs to reduce the breakdown voltage of the semiconductor device 100. When the region 204 is provided, since the bottom surface of the guard ring 92 is in contact with the drift region 18 at the low concentration, the increase in the electric field strength is suppressed.

A maximum value of a donor concentration in the high concentration region 202 is set as Dmax. In addition, a donor concentration of the drift region 18 is set as Db. The donor concentration of the drift region 18 below the guard ring 92 and in the center of the semiconductor substrate 10 in the depth direction may be set as the donor concentration Db. The donor concentration Dmax may be 10 or more times as high as the donor concentration Db. In this case, a position in which the donor concentration becomes 2 times as high as Db may be set as a boundary between the high concentration region 202 and the drift region 18. Alternatively, a position where the donor concentration of the drift region 18 starts to increase to be higher than Db may be set as the boundary between the high concentration region 202 and the drift region 18.

A width W2 of the region 204 in the X axis direction is narrower than a width W1 of the guard ring 92 on the upper surface 21 of the semiconductor substrate 10. The W2 may be equal to or more than 10% of the width W1, may be equal to or more than 30% of the width W1, may be equal to or more than 50% of the width W1, or may also be equal to or more than 70% of the width W1.

Figure 6:
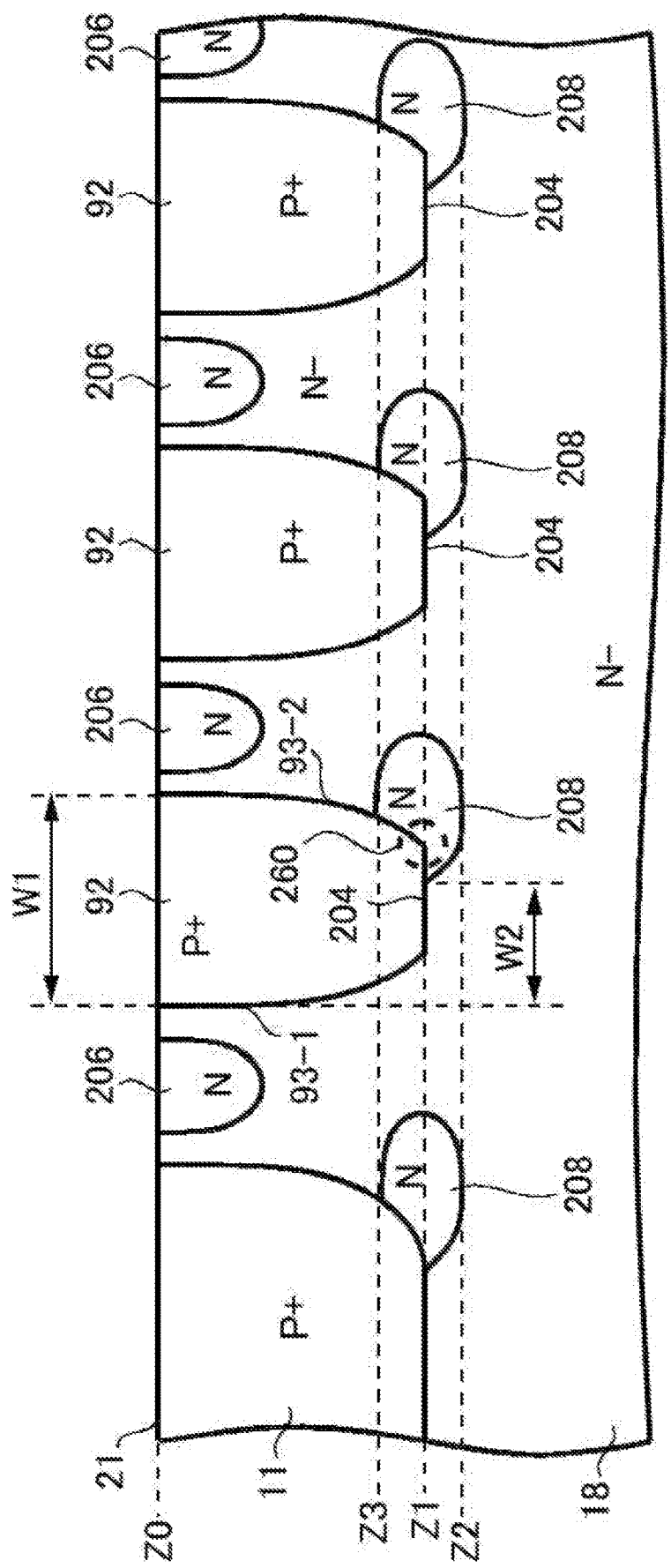
FIG. 6 is a drawing illustrating another example of a high concentration region 202.

FIG. 6 is a drawing illustrating another example of the high concentration region 202. Structures other than the high concentration region 202 are the same as the example illustrated in FIG. 5. The high concentration region 202 in this example has an upper part 206 and a lower part 208. The upper part 206 and the lower part 208 are provided while being separated from each other. In this example, the drift region 18 is provided between the upper part 206 and the lower part 208. It is noted that in a case where the N type dopant is implanted from the upper surface 21 to the lower part 208, a donor may be formed in a region too through which the N type dopant has passed in some cases. In this case, the donor concentration is gradually decreased from the lower part 208 towards the upper surface 21. The donor concentration may also be gradually decreased from the lower part 208 towards the upper part 206 between the lower part 208 and the upper part 206. For example, in a case where hydrogen is used as the N type dopant, a vacancy defect (V) formed in the region through which hydrogen has passed, oxygen (0) contained in the semiconductor substrate 10, and hydrogen (H) diffused from the lower part 208 are combined to form a VOH defect. The VOH defect functions as a donor.

The upper part 206 is provided in contact with the upper surface 21 of the semiconductor substrate 10 between the two guard rings 92. The upper part 206 may be arranged to be away from the guard ring 92. Thus, the diffusion of the donor that has been doped at a high concentration in the upper part 206 into the guard ring 92 can be suppressed. In another example, the upper part 206 may also be in contact with the guard ring 92.

The lower part 208 is provided from a position shallower than the lower end of the guard ring 92 to the position Z2 deeper than the lower end of the guard ring 92. The lower part 208 in this example is provided in contact with a side surface 93-2 farther from the well region 11 out of two side surfaces 93-1 and 93-2 of the guard ring 92. The side surface 93-1 of the guard ring 92 in FIG. 6 is a surface on the well region 11 side relative to the center of the guard ring 92 in the X axis direction. The side surface 93-2 of the guard ring 92 is a surface opposite to the side surface 93-1. The lower part 208 may not be in contact, or may also be in contact, with the side surface 93-1. When the lower part 208 is provided in contact with the side surface 93-2, it is possible to protect the region where the electric field tends to concentrate. The lower part 208 is preferably in contact with the lower region 260. In addition, the width W2 of the region 204 in this example is wider than a half of the width W1 of the guard ring 92.

A position of an upper end of the lower part 208 in the Z axis direction is set as Z3. A distance Z1-Z3 between the positions Z1 and Z3 in the Z axis direction may be the same as a distance Z2-Z1 between the positions Z1 and Z2 in the Z axis direction. The distance Z2-Z1 may also be longer than the distance Z1-Z3. Thus, it becomes easier to protect the region where the electric field tends to concentrate. The distance Z2-Z1 may also be shorter than the distance Z1-Z3.

The guard ring 92 and the high concentration region 202 described with reference to FIG. 1 to FIG. 6 may be formed by implanting the dopant from the upper surface 21 of the semiconductor substrate 10. The guard ring 92 can be formed by selectively implanting a P type dopant such as boron from the upper surface 21 of the semiconductor substrate 10, and performing heat treatment.

The high concentration region 202 (the upper part 206 and the lower part 208 in this example) can be formed by selectively implanting the N type dopant such as hydrogen or phosphorus from the upper surface 21 of the semiconductor substrate 10, and performing heat treatment. The N type dopant may be implanted to a plurality of depth positions by changing acceleration energy.

It is noted that when hydrogen is used as the N type dopant, the high concentration region 202 in the deep position can be easily formed. It is however noted that when heat treatment is performed at a high temperature for a long period of time after hydrogen is implanted, the hydrogen donor disappears. For this reason, the hydrogen implantation and heat treatment processes are preferably performed in a late stage of a fabrication process of the semiconductor device 100. For example, when hydrogen is implanted after the protective film is formed above the field plate 94 or the like, it is possible to suppress the disappearance of the hydrogen donor. The implantation of hydrogen may be performed from the upper surface 21 of the semiconductor substrate 10, or may also be performed from the lower surface 23.

In the examples described with reference to FIG. 1 to FIG. 6, at least a part of the high concentration region 202 may be provided in a region that is not covered by the field plate 94. In other words, at least a part of the high concentration region 202 is not overlapped with the field plate 94 in the Z axis direction. At least a part of the high concentration region 202 may be formed by implanting the N type dopant while the field plate 94 is used as the mask.

In addition, the high concentration region 202 may also be formed by using a plural types of N type dopants. For example, the upper part 206 may be formed by implanting a first dopant such as phosphorus, and the lower part 208 may be formed by implanting a second dopant such as hydrogen. In this case, the upper part 206 contains the first dopant (phosphorus) at a higher concentration than the second dopant (hydrogen), and the lower part 208 contains the second dopant (hydrogen) at a higher concentration than the first dopant (phosphorus).

In addition, the dose amount of the N type dopant implanted to the high concentration region 202 may also be adjusted according to the specific resistance or the donor concentration of the semiconductor substrate 10 before the implantation of the N type dopant. Thus, the specific resistance or the donor concentration of the semiconductor substrate 10 after the formation of the high concentration region 202 can be more accurately adjusted.

Figure 7A:
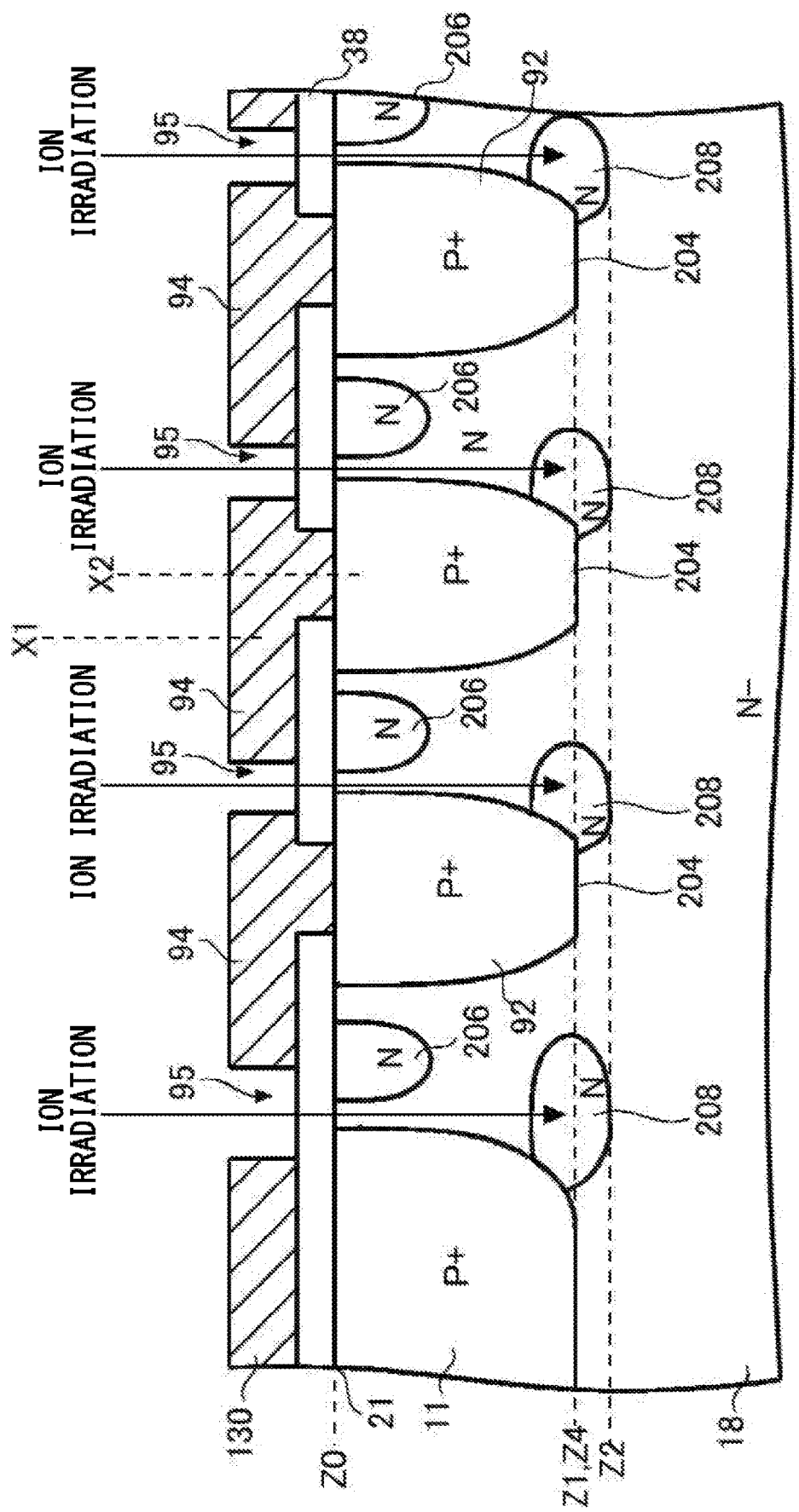
FIG. 7A is a drawing for describing a part of manufacturing processes of the semiconductor device 100.
Figure 7B:
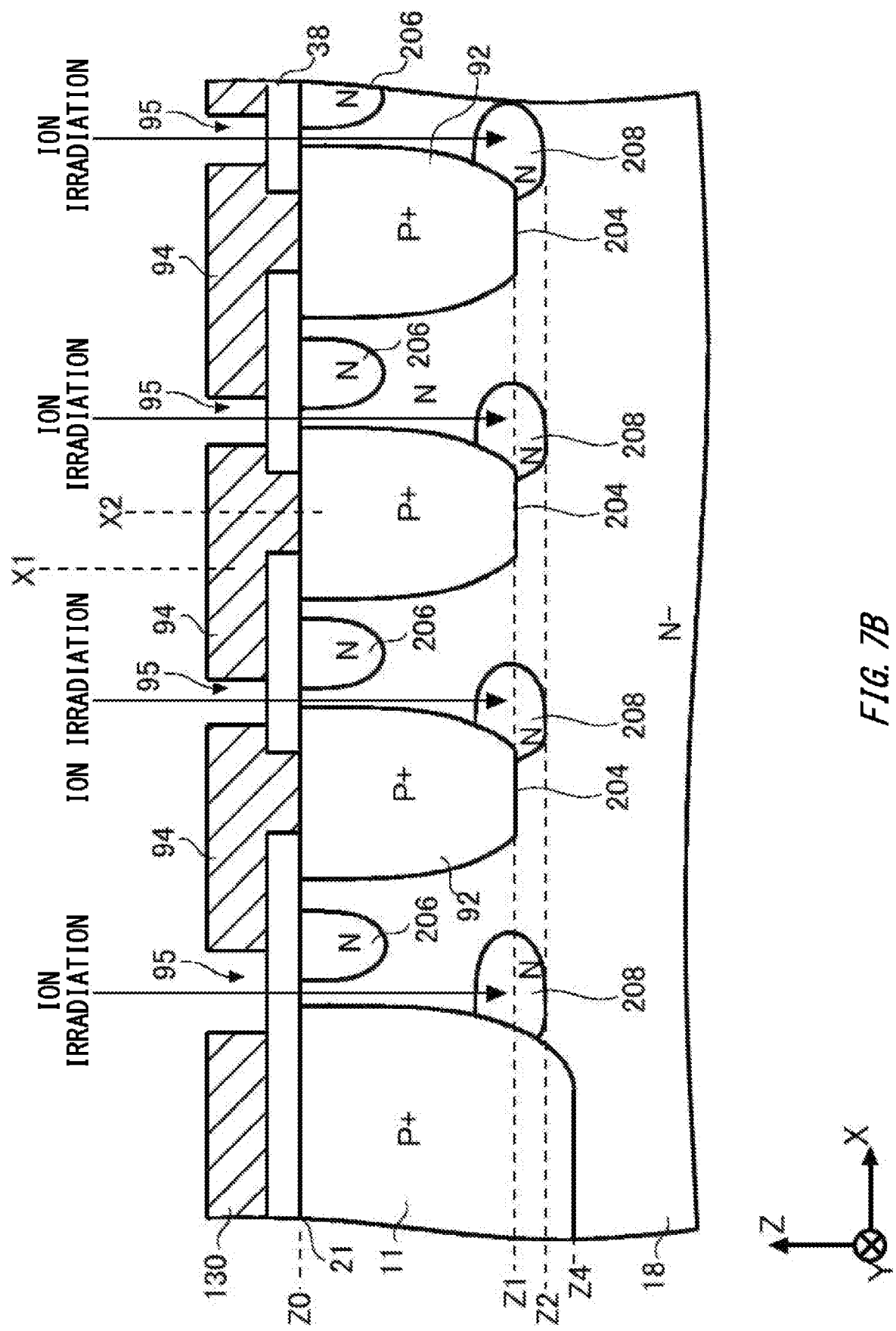
FIG. 7B is a drawing for describing another example of a part of the manufacturing processes of the semiconductor device 100.

FIG. 7A and FIG. 7B are drawings for describing a part of manufacturing processes of the semiconductor device 100. FIG. 7A and FIG. 7B illustrate a process for forming the lower part 208 of the high concentration region 202. In this example, the N type dopant is implanted to the lower part 208 while each of the electrodes such as the field plate 94, the outer peripheral gate runner 130, and the emitter electrode 52 are used as the masks. In the edge terminal structure portion 90, the N type dopant is implanted from a gap 95 between the mutually adjacent field plates 94.

In this example, after the interlayer dielectric film 38 and each of the electrodes such as the field plate 94 are formed, the N type dopant is implanted. The N type dopant is hydrogen, for example. In addition, after the well region 11, the upper part 206, and the guard ring 92 are formed, the N type dopant may be implanted to the lower part 208. After the lower part 208 is formed by implanting the N type dopant, a protective film such as a polyimide or nitride film may be formed above each of the electrodes such as the field plate 94, the outer peripheral gate runner 130, and the emitter electrode 52.

According to this example, since the field plate 94 is used as the mask, the fabrication process of the semiconductor device 100 can be simplified. A region of at least a part of the lower part 208 in this example is overlapped with the gap 95 in the Z axis direction. A region where the donor concentration becomes the maximum value in the lower part 208 may also be overlapped with the gap 95 in the Z axis direction.

The field plate 94 may also be overlapped with a region of a part of the lower part 208 in the Z axis direction. When the N type dopant implanted to the lower part 208 diffuses in the X axis direction, a part of the lower part 208 can be formed in a position overlapped with the field plate 94. The field plate 94 may also be overlapped with a region of a part or whole of the upper part 206.

A central position of the field plate 94 in the X axis direction is set as X1, and a central position of the guard ring 92 in the X axis direction is set as X2. The central position X1 of the field plate 94 may be arranged on the well region 11 side relative to the central position X2 of the guard ring 92. Thus, the lower part 208 is not formed in the lower region 261 illustrated in FIG. 5, and it becomes easier to form the lower part in the lower region 260.

In this example, a position of the lower end of the well region 11 in the Z axis direction is set as Z4. In FIG. 7A, the position Z1 of the lower end of the guard ring 92 is matched with the position Z4 of the lower end of the well region 11. In other words, the lower part 208 is arranged up to a region deeper than the well region 11. On the other hand, in FIG. 7B, the position Z4 of the lower end of the well region 11 is arranged in a position deeper than the position Z1 of the lower end of the guard ring 92. In addition, in FIG. 7B, the position Z2 of the lower end of the lower part 208 is arranged to be closer to the upper surface 21 than the position Z4 of the lower end of the well region 11. In other words, the lower part 208 is arranged in a region shallower than the well region 11. In addition, in any of FIG. 7A and FIG. 7B, the doping concentration of the lower part 208 is lower than the doping concentration of the well region 11.

Figure 8A:
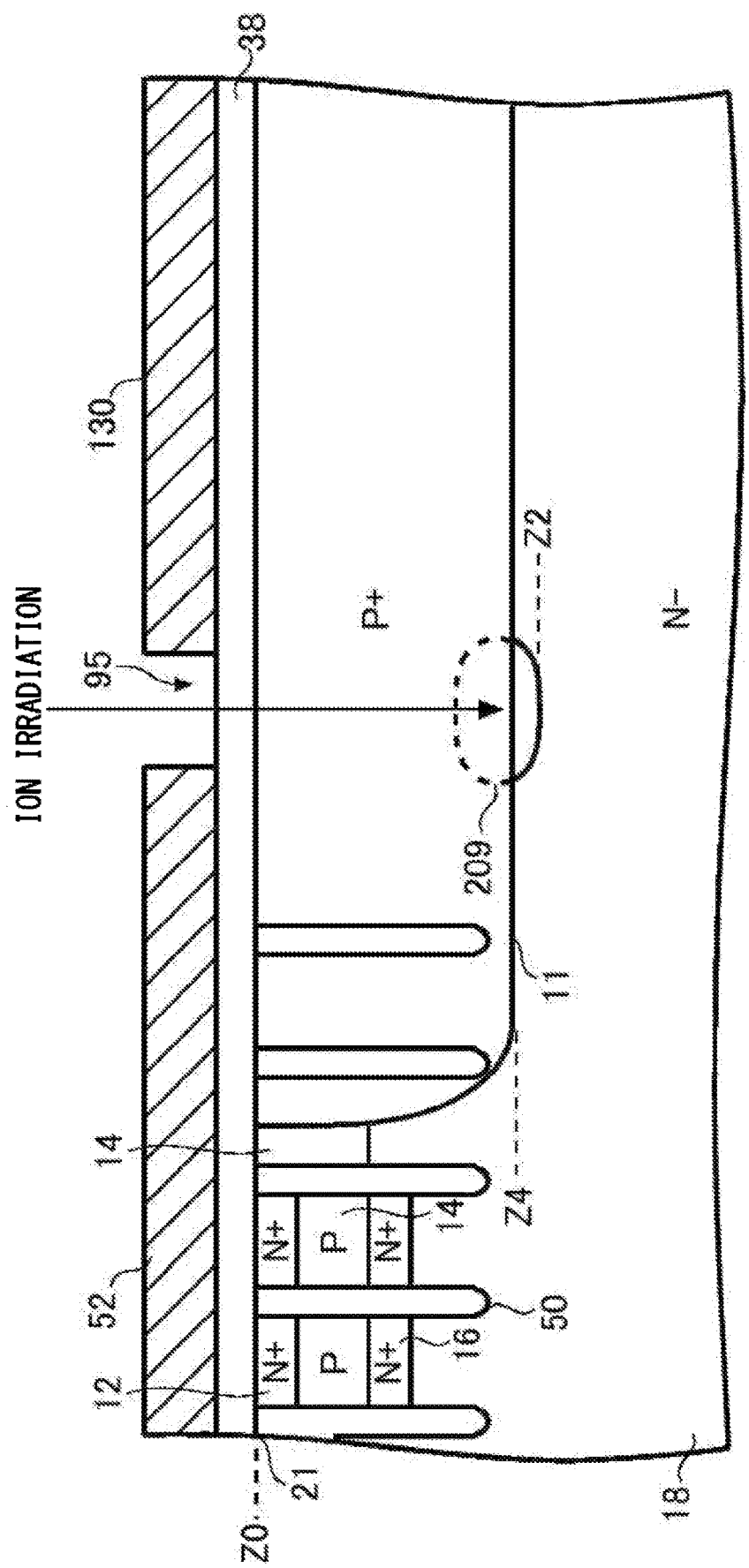
FIG. 8A is a cross sectional view in the vicinity of an emitter electrode 52 and an outer peripheral gate runner 130.
Figure 8B:
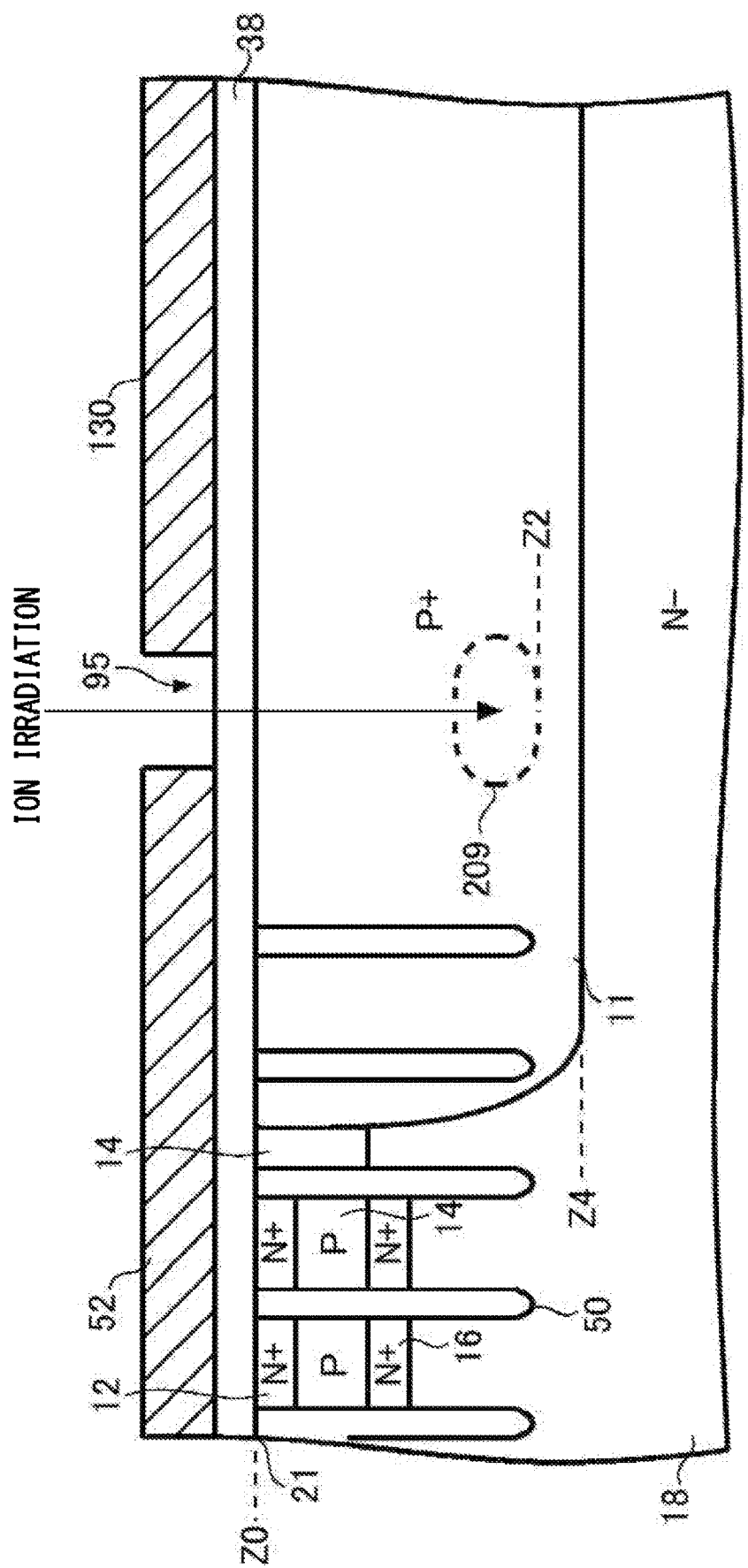
FIG. 8B is a drawing illustrating another example of the cross section in the vicinity of the emitter electrode 52 and the outer peripheral gate runner 130.

FIG. 8A ad FIG. 8B are cross sectional views in the vicinity of the emitter electrode 52 and the outer peripheral gate runner 130. FIG. 8A corresponds to the example of FIG. 7A, and FIG. 8B corresponds to the example of FIG. 7B. In other words, the depth position Z4 of the well region 11 in FIG. 8A is the same as the example illustrated in FIG. 7A, and the depth position Z4 of the well region 11 in FIG. 8B is the same as the example illustrated in FIG. 7B. In FIG. 8A and FIG. 8B, the structure of the trench or the like is simplified, and also the contact hole in the interlayer dielectric film 38 is omitted. A gap 95 is provided between the emitter electrode 52 and the outer peripheral gate runner 130.

When the N type dopant is implanted while each of the electrodes such as the field plate 94, the outer peripheral gate runner 130, and the emitter electrode 52 is used as the mask, the N type dopant is also implanted from the gap 95 between the outer peripheral gate runner 130 and the emitter electrode 52. In FIG. 8A and FIG. 8B, a region where the N type dopant is implanted is set as a region 209. The region 209 is arranged in the same depth position as the lower part 208 illustrated in FIG. 7A and FIG. 7B, and the like.

The well region 11 is formed below the gap 95. For this reason, in a case where the lower ends of the well region 11 and the guard ring 92 are aligned with each other as illustrated in FIG. 7A, when the lower part 208 is arranged in a position deeper than the well region 11, the lower part 208 is formed so as to protrude from the lower end of the well region 11 as illustrated in FIG. 8A.

In contrast, as illustrated in FIG. 7B, in a case where the position Z4 of the lower end of the well region 11 is deeper than the position Z1 of the lower end of the guard ring 92, when the lower part 208 is arranged in a region shallower than the well region 11, a configuration can be adopted where the lower part 208 does not protrude from the lower end of the well region 11 as illustrated in FIG. 8B. In this case, the position Z4 of the lower end of the well region 11 is farther away from the upper surface 21 of the semiconductor substrate 10 than the position Z2 of the lower end of the guard ring 92. In other words, the well region 11 is provided to be deeper than the guard ring 92. Thus, the lower part 208 can be formed to be deeper than the guard ring 92 and also formed to be shallower than the well region 11. It is noted that in the examples of FIG. 7A and FIG. 8A, a mask for decelerating or shielding ions may also be provided in a position covering the gap 95 above the well region 11. According to this too, a configuration can be adopted where the lower part 208 does not protrude from the lower end of the well region 11.

In addition, in a case where the doping concentration of the lower part 208 is higher than the doping concentration of the well region 11, the conductivity type of the region 209 of FIG. 8A and FIG. 8B is reversed from the P type to the N type. For this reason, a PN junction is formed in an unintended position, and a property of the semiconductor device 100 may fluctuate in some cases.

In contrast, when the doping concentration of the lower part 208 is set to be lower than the doping concentration of the well region 11, it is possible to avoid a situation where the conductivity type of the region 209 becomes the N type. The doping concentration of the well region 11 may be higher than, may be the same as, or may also be lower than, the doping concentration of the guard ring 92. The doping concentration of the guard ring 92 may be equal to or lower than $1.0 \times 10^{17}$ atoms/cm$^3$.

In the examples of FIG. 7A to FIG. 8B, the examples have been described in which the ion implantation of the lower part 208 is performed while the field plate 94 is used as the mask. In another example, after a protective film made of polyimide or the like is formed above the field plate 94 or the like, the ion implantation may also be performed while the protective film is used as a mask.

Figure 9:
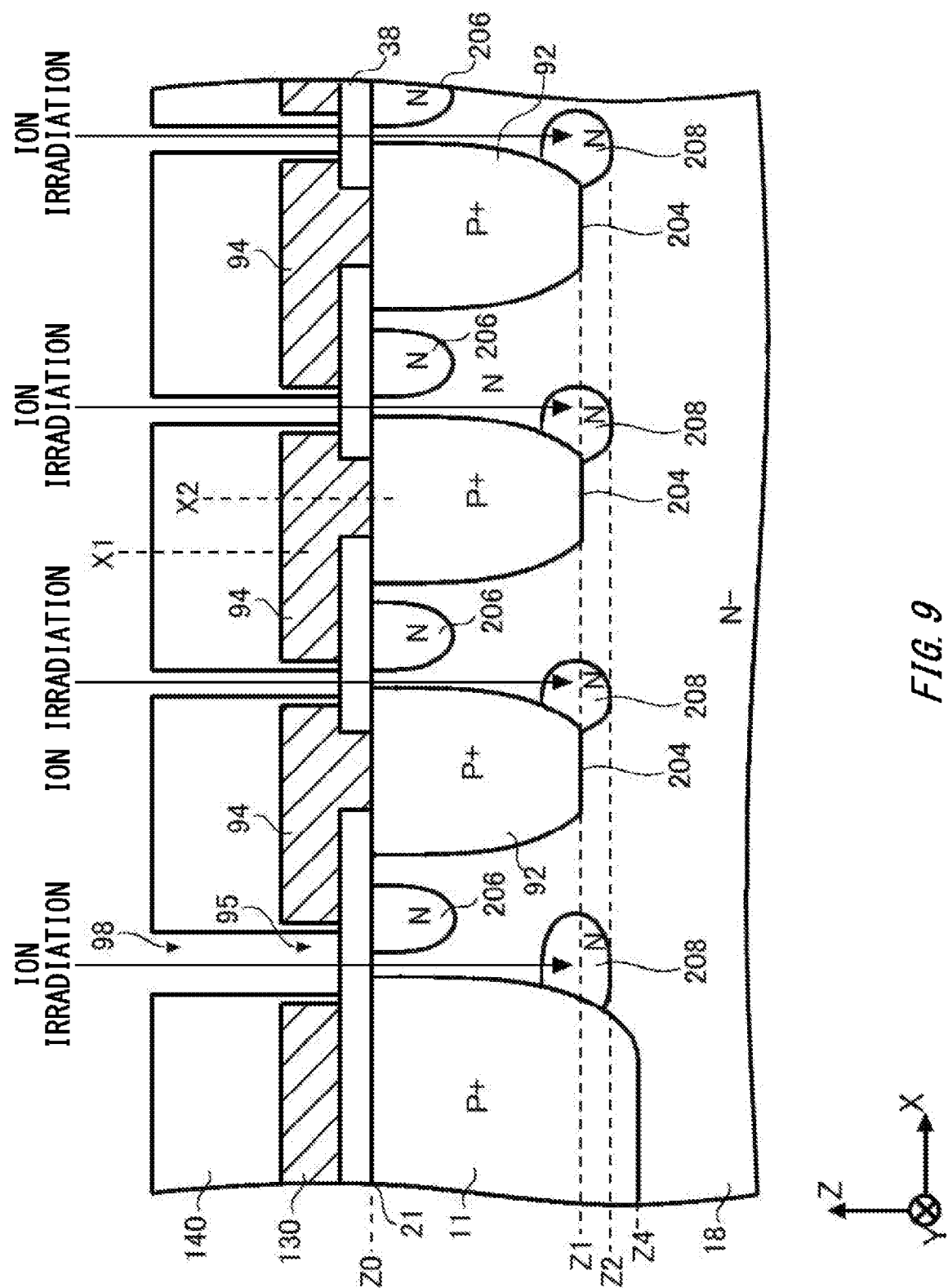
FIG. 9 is a drawing for describing another example of a part of the manufacturing processes of the semiconductor device 100.
Figure 10:
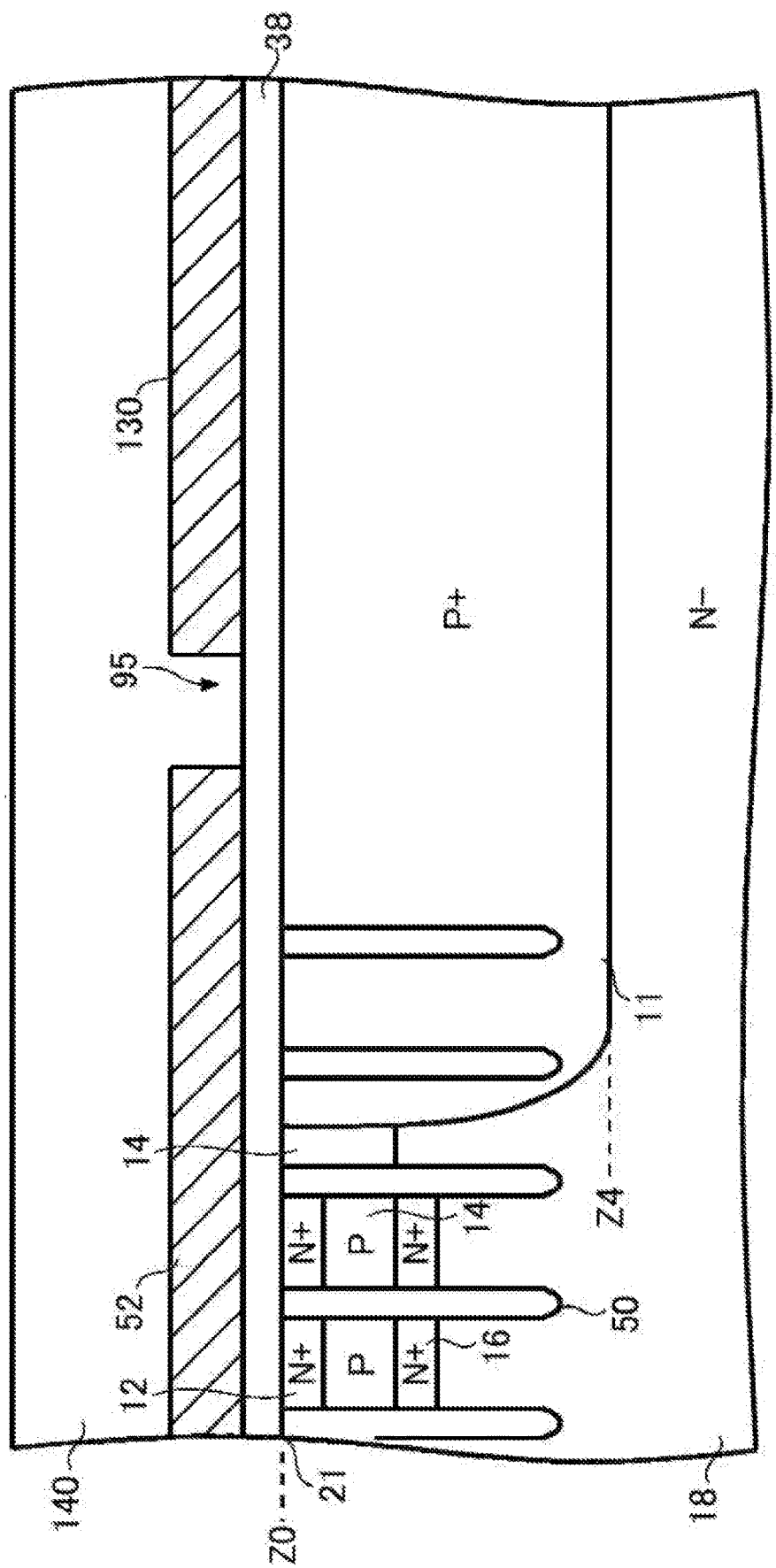
FIG. 10 is a drawing illustrating another example of the cross section in the vicinity of the emitter electrode 52 and the outer peripheral gate runner 130.

FIG. 9 and FIG. 10 are drawings illustrating examples in which the ion implantation is performed while a protective film 140 is used as the mask. FIG. 9 is a drawing illustrating another example of the cross section in the vicinity of the edge terminal structure portion 90. FIG. 10 is a drawing illustrating another example of the cross section in the vicinity of the emitter electrode 52 and the outer peripheral gate runner 130.

As illustrated in FIG. 9, the protective film 140 has an opening 98 above the lower part 208. The opening 98 passes through the gap 95 between the field plates 94. Both the protective film 140 and the field plate 94 are not provided in a position where the opening 98 is overlapped with the gap 95. In this example, the N type dopant is implanted to the region of the lower part 208 via the opening 98 and the gap 95. At this time, as illustrated in FIG. 10, when an opening of the protective film 140 is not provided on the well region 11, it is also possible to adopt a configuration where the ion implantation to the well region 11 is not performed. It is noted that a recess may also be used instead of the opening 98. The recess may also be formed by etching the protective film 140, or may also be formed at the time of deposition of the protective film 140. In a case where the protective film 140 is a nitride film or the like, at the time of the deposition, the recess that reflects the presence or absence of the gap 95 between the field plates 94 may be formed.

In addition, the N type dopant implantation may also be performed by forming a mask pattern using photoresist or the like instead of the protective film 140. Alternatively, when the ion implantation to the lower part 208 is performed while the gap between the field plates 94 on the guard ring 92 is used as the mask, resist may also cover a top of the gap 95 between the field plates 94 on the well region 11. In this case, it is also possible to adopt a configuration where the ion implantation to the semiconductor substrate 10 is not performed by being shielded by the resist, or it is also possible to adopt a configuration where since deceleration occurs by the resist, and the region 209 becomes shallow and does not protrude to the lower side of the well region 11.

Figure 11:
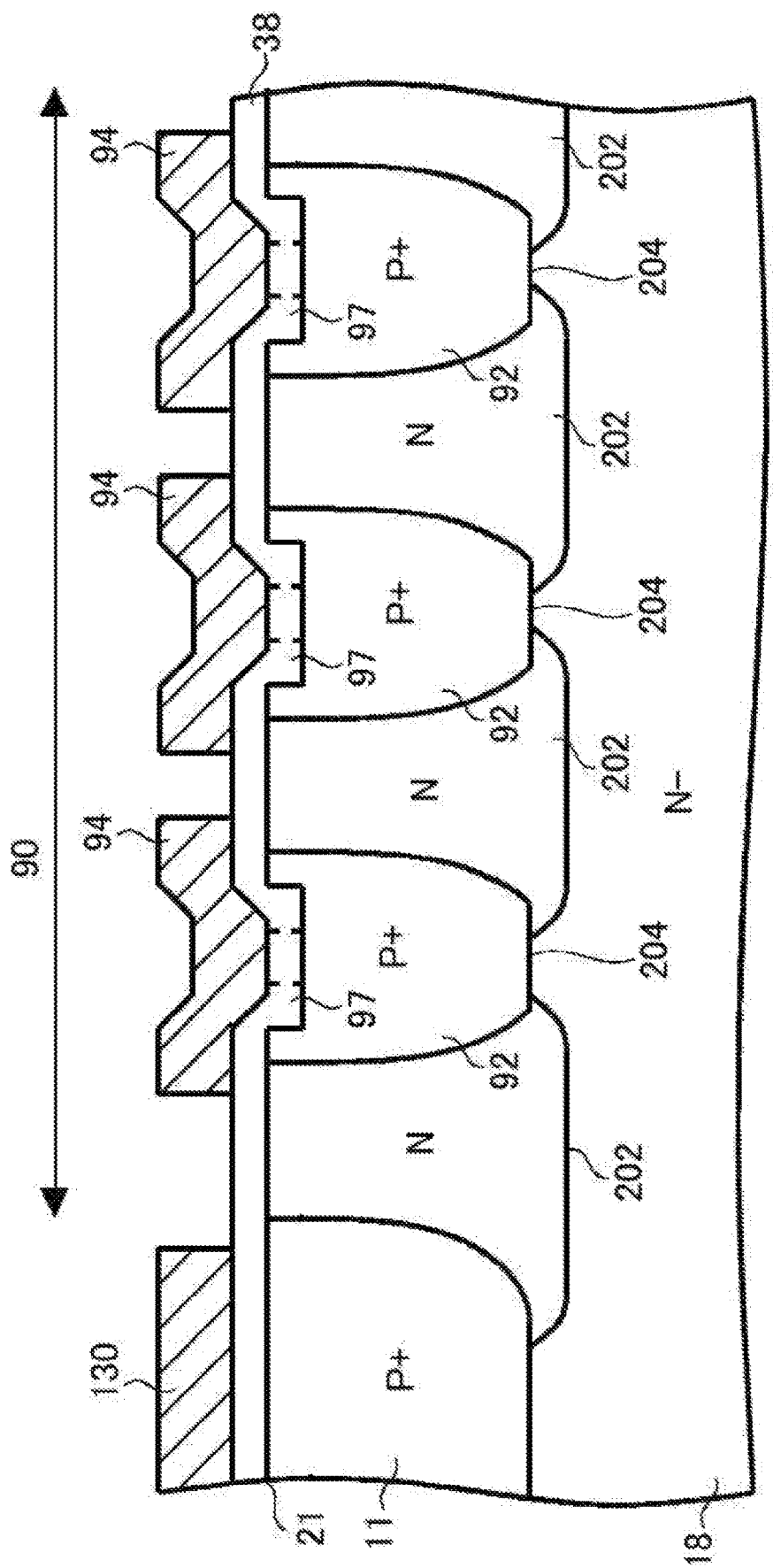
FIG. 11 is a drawing illustrating another structural example of the edge terminal structure portion 90.

FIG. 11 is a drawing illustrating another structural example of the edge terminal structure portion 90. The edge terminal structure portion 90 in this example differs from the edge terminal structure portion 90 described with reference to FIG. 1 to FIG. 10 in that the upper surface 21 of the semiconductor substrate 10 has a recess portion 97. Structures other than the recess portion 97 may be the same as the edge terminal structure portion 90 described with reference to FIG. 1 to FIG. 10.

The recess portion 97 is a recess provided on the upper surface 21 of the semiconductor substrate 10 in the Z axis direction. The recess portion 97 can be formed by etching the upper surface 21 of the semiconductor substrate 10. The recess portion 97 in this example is formed in a region where the guard ring 92 is provided. In other words, the guard ring 92 is exposed on a bottom surface of the recess portion 97. In this example, the high concentration region 202 is not exposed on the bottom surface of the recess portion 97. In another example, the high concentration region 202 may be exposed on the bottom surface of the recess portion 97 too.

As illustrated in FIG. 11, the interlayer dielectric film 38 may be provided inside the recess portion 97. The field plate 94 may also be provided inside the recess portion 97. As represented by a broken line in FIG. 11, the field plate 94 may be in contact with the guard ring 92 on the bottom surface of the recess portion 97. A configuration may also be adopted where the field plate 94 is not in contact with the guard ring 92.

After the formation of the recess portion 97, the P type dopant for forming the guard ring 92 may be implanted. Thus, it becomes easier to form the guard ring 92 up to a deep position. In another example, after the formation of the guard ring 92, the recess portion 97 may also be formed.

The recess portion 97 may also be formed in a region where the high concentration region 202 is provided instead of the guard ring 92. In this case, it becomes easier to form the high concentration region 202 up to a deep position.

Figure 12:
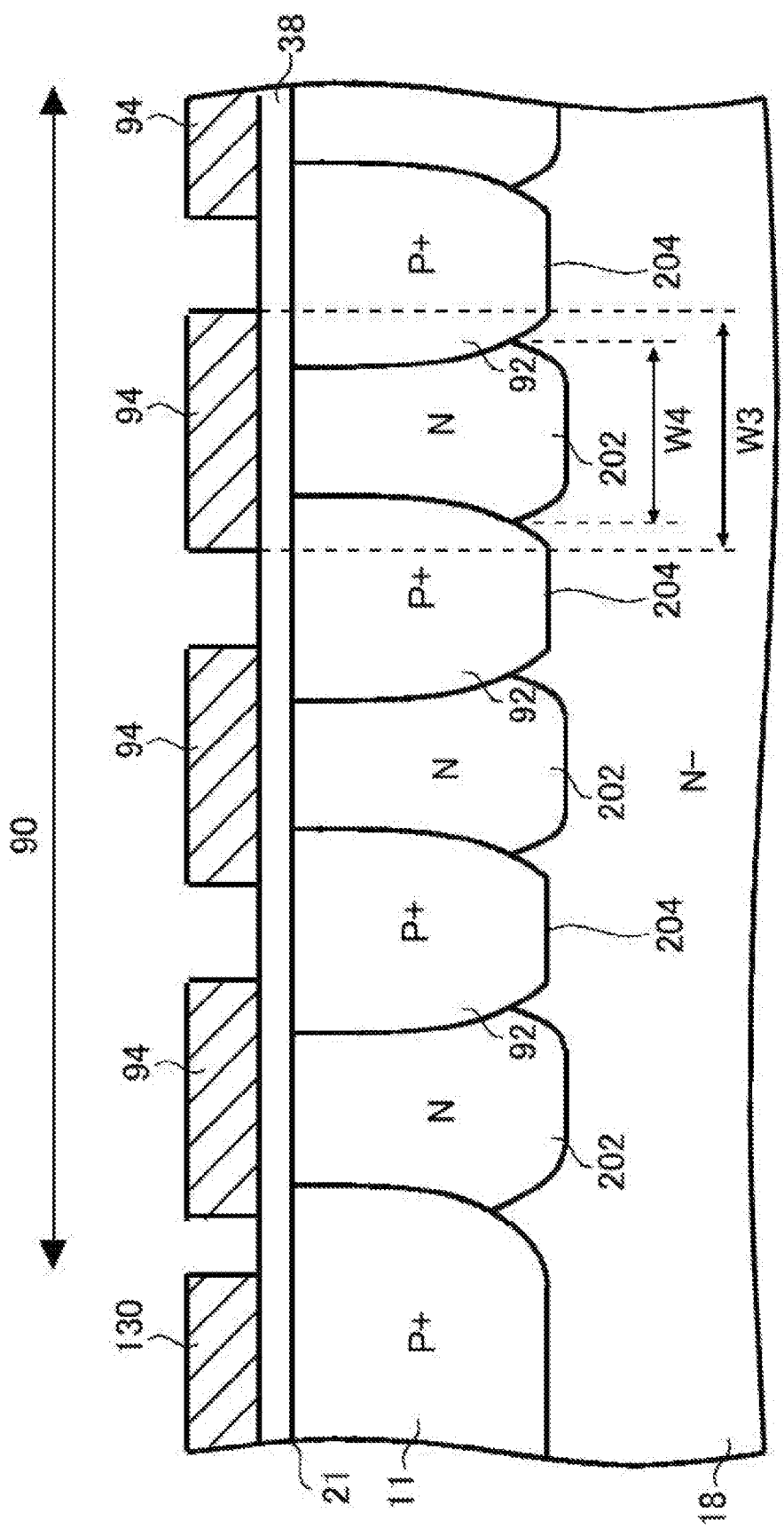
FIG. 12 is a drawing illustrating another arrangement example of field plates 94.

FIG. 12 is a drawing illustrating another arrangement example of the field plates 94. The arrangement of the field plate 94 in this example may be applied to each of the examples described with respect to FIG. 1 to FIG. 6, and FIG. 11.

The field plate 94 in this example is arranged above the high concentration region 202. The field plate 94 may be arranged so as to cover the whole of the high concentration region 202. In other words, a width W3 of the field plate 94 in the X axis direction is wider than a width W4 of the high concentration region 202 in the X axis direction. The field plate 94 may be arranged to stride across adjacent two of the guard rings 92 in the X axis direction. In this example, the field plate 94 is not connected to the guard ring 92.

Figure 13:
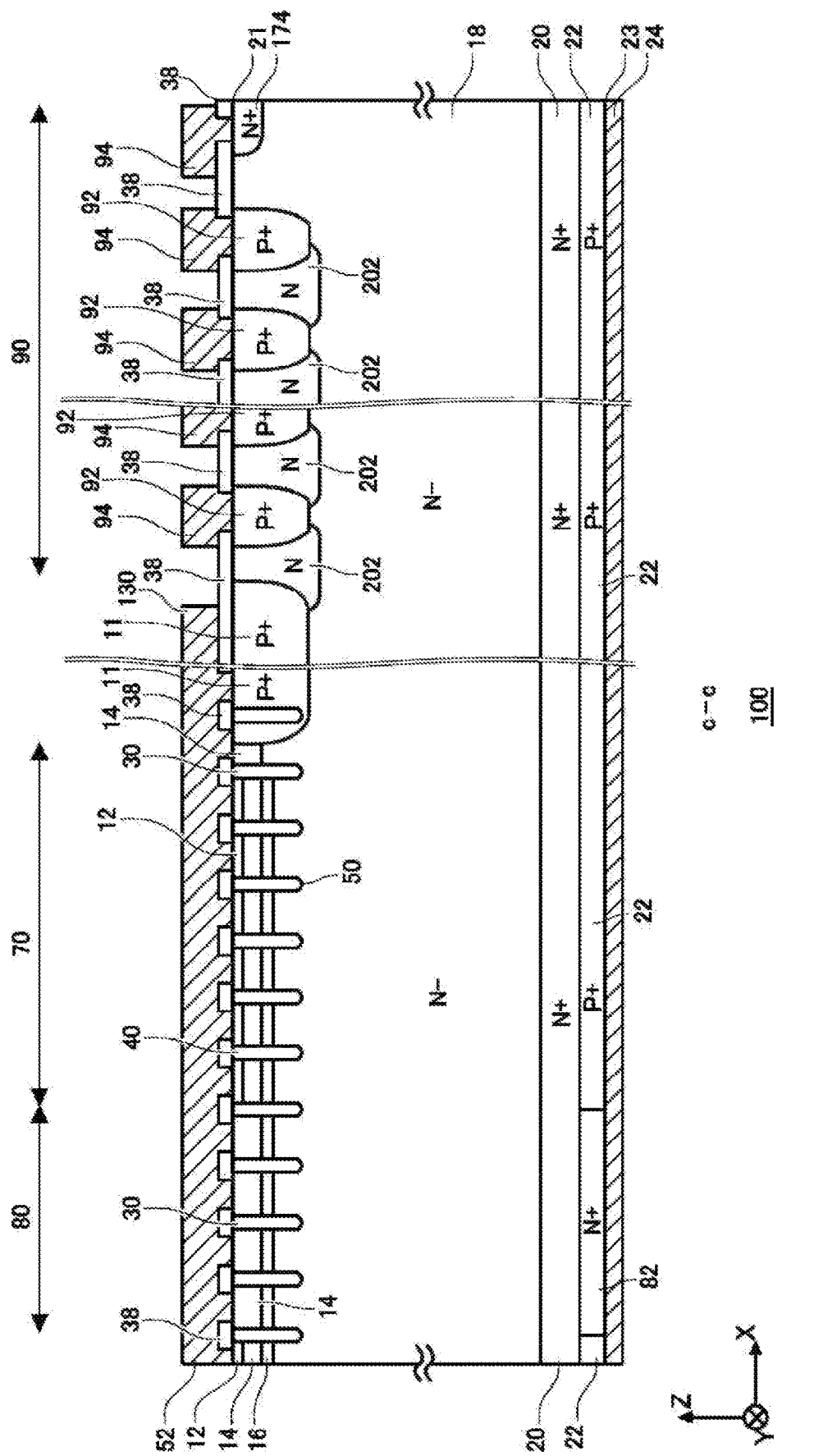
FIG. 13 is a drawing illustrating another example of the cross section taken along c-c in FIG. 1.

FIG. 13 is a drawing illustrating another example of the cross section taken along c-c in FIG. 1. It is different in that it does not include the high concentration region 203 in the configuration of the semiconductor device 100 described in association with FIG. 4 or the like. The other structure is the same as the semiconductor device 100 according to any aspect described in the present specification or the like. In other words, the semiconductor device 100 may not include the high concentration region 203.

Figure 14:
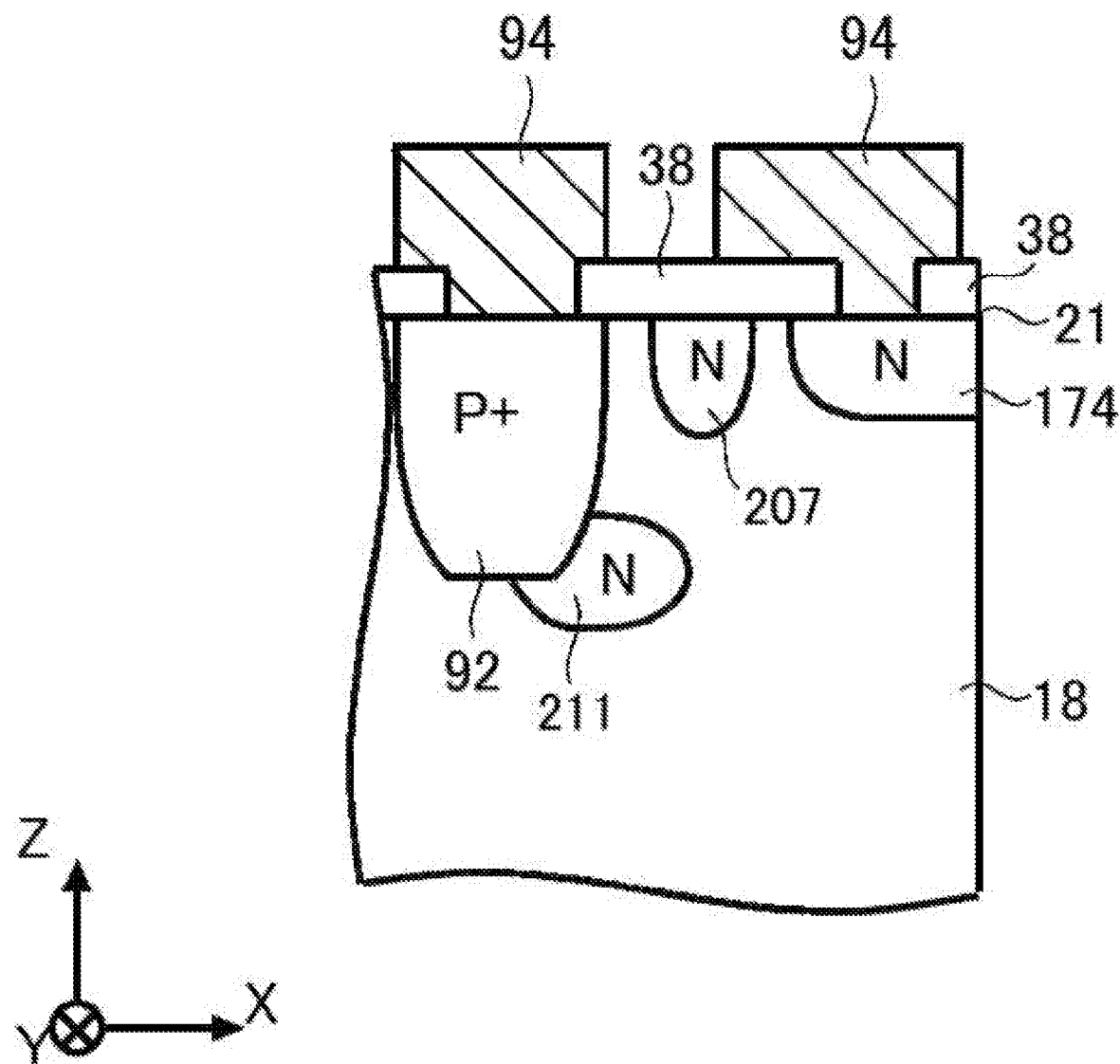
FIG. 14 is a drawing illustrating another structural example between the guard ring 92 arranged on the outermost side and a channel stopper 174.

FIG. 14 is a drawing illustrating another structural example between the guard ring 92 arranged on the outermost side and the channel stopper 174. The semiconductor device 100 in this example includes an upper part 207 and a lower part 211 instead of the high concentration region 203 illustrated in FIG. 13. The upper part 207 and the lower part 211 are N-type regions having a higher doping concentration than the drift region 18. In other words, the upper part 207 and the lower part 211 are one example of the high concentration region.

The upper part 207 may have the same structure and doping concentration distribution as the upper part 206 described with reference to FIG. 6 or the like. The lower part 211 may have the same structure and doping concentration distribution as the lower part 208 described with reference to FIG. 6 or the like. In another example, the upper part 207 may be provided up to a position shallower than the lower end of the upper part 206, or may also be provided up to a position deeper than the lower end of the upper part 206. In addition, the lower part 211 may be provided up to a position shallower than the lower end of the lower part 208, or may also be provided up to a position deeper than the lower end of the lower part 208. The doping concentration of the upper part 207 may be higher than the upper part 206, or may also be lower than the upper part 206. The doping concentration of the lower part 211 may be higher than the lower part 208, or may also be lower than the lower part 208.

Figure 15:
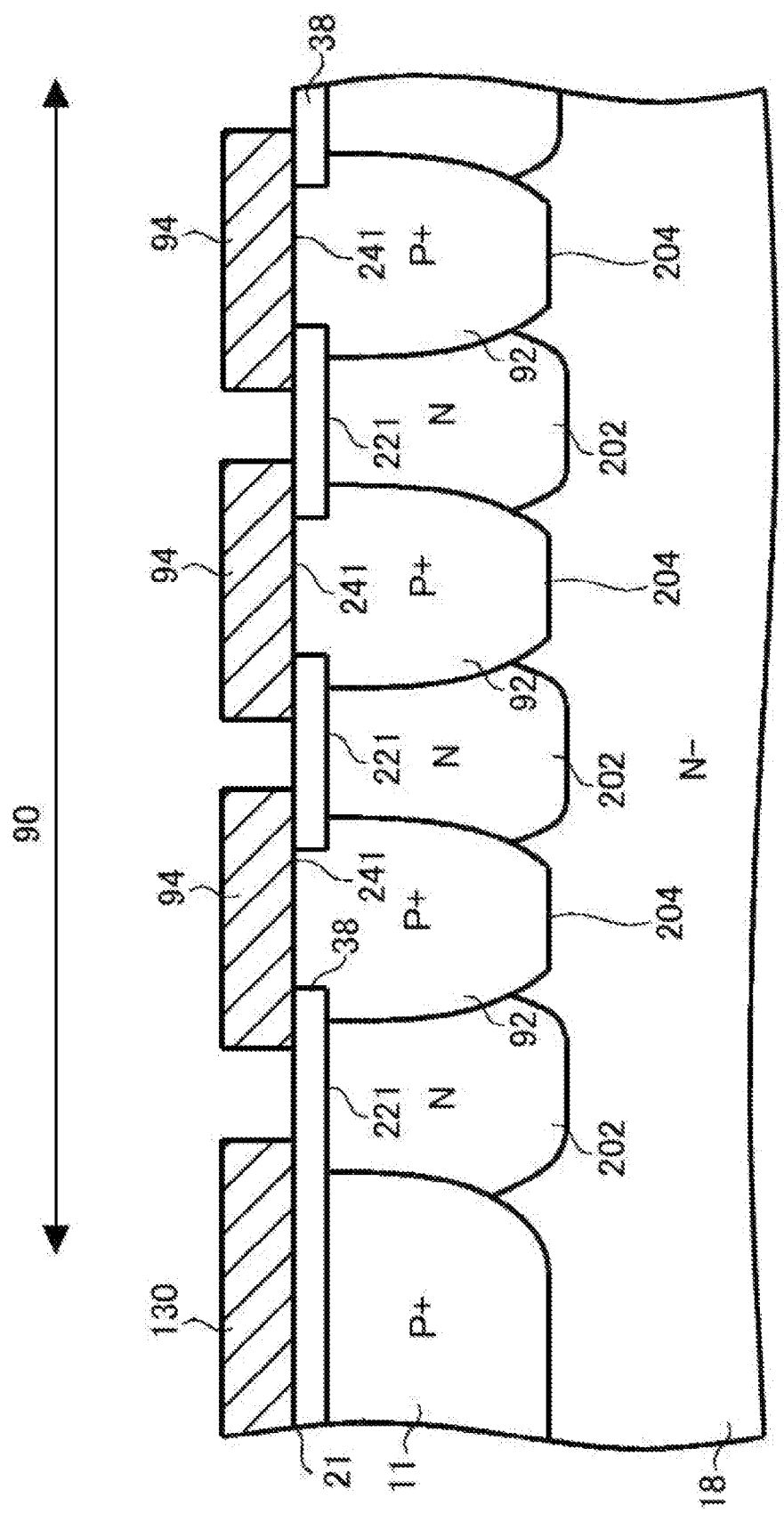
FIG. 15 is a drawing illustrating another structural example of the semiconductor device 100.

FIG. 15 is a drawing illustrating another structural example of the semiconductor device 100. In this example, an upper end 221 of the high concentration region 202 is arranged to be lower (that is, on a side closer to the lower surface 23 of the semiconductor substrate 10) than upper ends 241 of the guard rings 92 that are adjacent to each other. The other structure is the same as the semiconductor device 100 according to any aspect described in the present specification.

In this example, the guard ring 92 is in contact with the upper surface 21 of the semiconductor substrate 10. In other words, the upper end 241 of the guard ring 92 is arranged in the same depth position as the upper surface 21 of the semiconductor substrate 10. In addition, the upper end 221 of the high concentration region 202 is arranged to be lower than the upper surface 21 of the semiconductor substrate 10.

The high concentration region 202 may be covered with the interlayer dielectric film 38. At least a part of the interlayer dielectric film 38 in this example is arranged to be lower than the upper surface 21 of the semiconductor substrate 10. The interlayer dielectric film 38 may be arranged in a recess formed on the upper surface 21 of the semiconductor substrate 10. The whole of the interlayer dielectric film 38 in this example is arranged to be lower than the upper surface 21. The upper end of the interlayer dielectric film 38 may also be arranged in the same depth position as the upper surface 21 of the semiconductor substrate 10.

In addition, the interlayer dielectric film 38 may also be formed by locally oxidizing a region corresponding to a part of the upper surface 21 of the semiconductor substrate 10. In this case too, the lower end of the interlayer dielectric film 38 may be arranged to be lower than the upper surface 21. In this example, the upper end 221 of the high concentration region 202 has been described, but the upper end of the high concentration region 203, the upper end of the upper part 206, and the upper end of the upper part 207 may also be arranged in similar positions.

Figure 16:
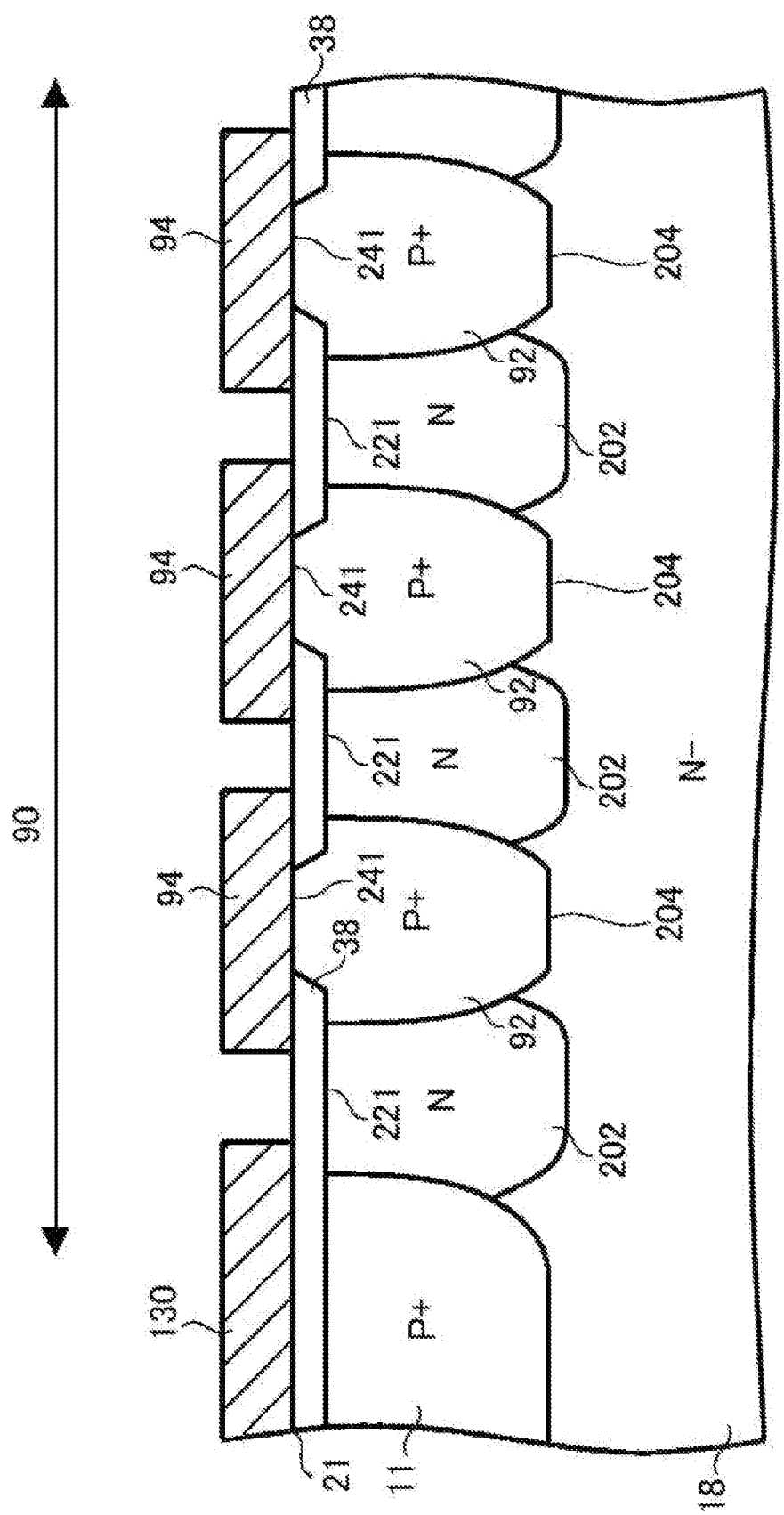
FIG. 16 is a drawing illustrating another structural example of an interlayer dielectric film 38.

FIG. 16 is a drawing illustrating another structural example of the interlayer dielectric film 38. The structure other than the interlayer dielectric film 38 is the same as the semiconductor device 100 according to any aspect described in the present specification. Side walls of the interlayer dielectric film 38 in this example are formed to be tapered. The cross sectional area of the interlayer dielectric film 38 on an XY plane is further increased towards the upper side. The interlayer dielectric film 38 in this example can be formed by flattening the LOCOS film formed by locally oxidizing the upper surface 21 of the semiconductor substrate 10 at the same height as the upper surface 21 of the semiconductor substrate 10. Instead, the interlayer dielectric film 38 in this example can be formed by forming the LOCOS film by locally oxidizing the recess portion after etching the upper surface 21 of the semiconductor substrate 10 into a recess. Instead, the interlayer dielectric film 38 in this example can be formed by thermally-oxidizing the semiconductor substrate 10 after etching the upper surface 21 of the semiconductor substrate 10 into a recess, and then removing the thermally-oxidized film to expose Si such that the whole becomes flat.

Figure 17:
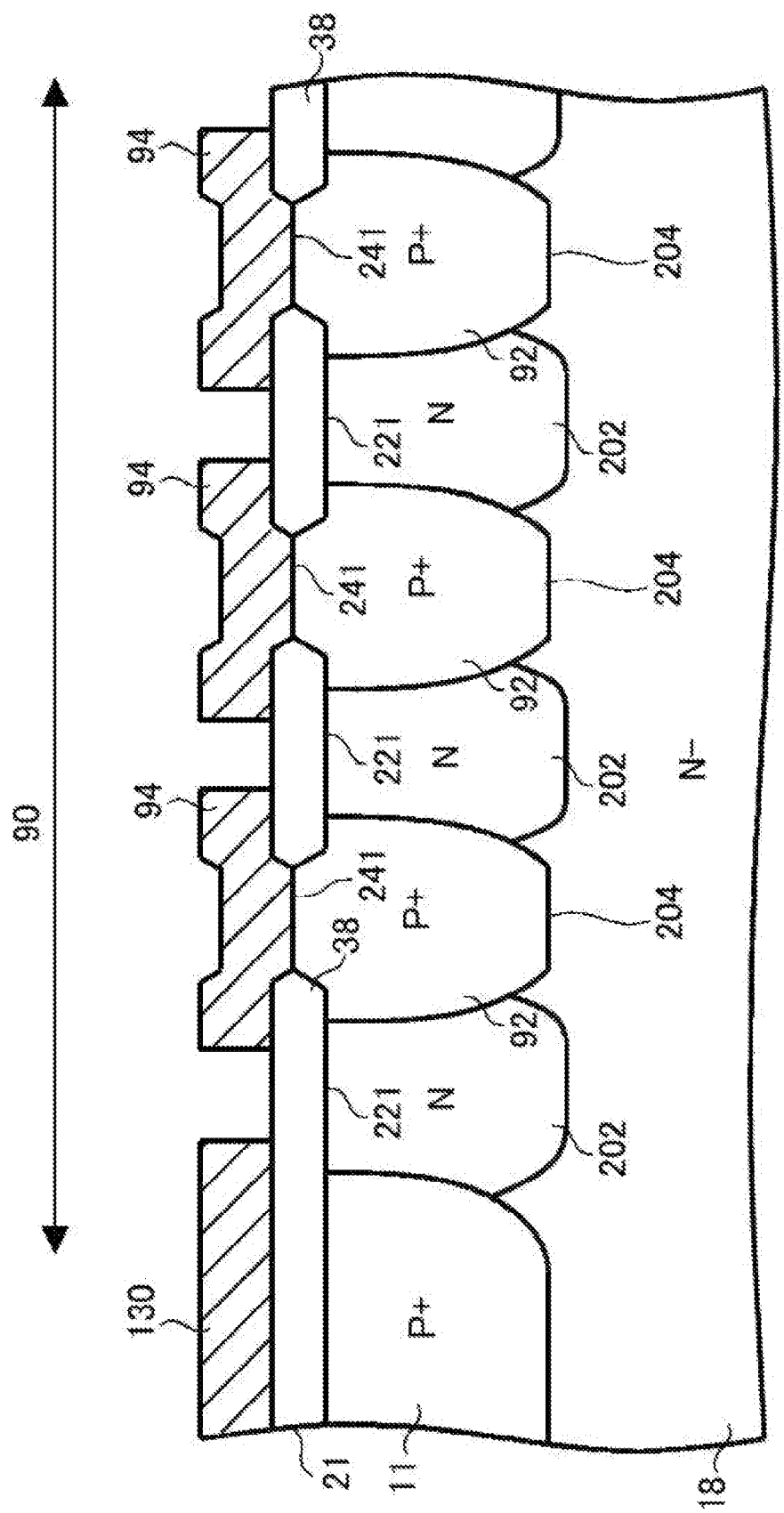
FIG. 17 is a drawing illustrating another structural example of the interlayer dielectric film 38.

FIG. 17 is a drawing illustrating another structural example of the interlayer dielectric film 38. The structure other than the interlayer dielectric film 38 is the same as the semiconductor device 100 according to any aspect described in the present specification. The interlayer dielectric film 38 in this example has its lower part arranged to be lower than the upper surface 21, and its upper part arranged to be higher than the upper surface 21. In addition, at least a part of the lower part of the interlayer dielectric film 38 in this example is formed to be tapered. The cross sectional area of the lower part of the interlayer dielectric film 38 on the XY plane is further increased towards the upper side. At least a part of the upper part of the interlayer dielectric film 38 is also formed to be tapered. The cross sectional area of the upper part of the interlayer dielectric film 38 on the XY plane is further increased towards the lower side. The interlayer dielectric film 38 in this example is an LOCOS film formed by locally oxidizing the upper surface 21 of the semiconductor substrate 10. Instead, the interlayer dielectric film 38 in this example can be formed by thermally-oxidizing the semiconductor substrate 10 after etching the upper surface 21 of the semiconductor substrate 10 into a recess, and selectively removing the thermally-oxidized film to expose Si.

It is noted that, without limitation to the above-described steps, the interlayer dielectric film 38 may be produces in a manner where the composition or shape is different. As one example, the interlayer dielectric film 38 of the active portion 160 and the interlayer dielectric film 38 of the edge terminal structure portion 90 may have different material and membrane thickness. In addition, in the examples of FIG. 15 and FIG. 17, the interlayer dielectric film 38 is formed at the side of the lower surface 23 relative to the upper surface 21. This is called recess. However, the interlayer dielectric film 38 of the active portion 160 may be formed from the upper surface 21 toward +Z direction without forming recess.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10 . . . semiconductor substrate, 11 . . . well region, 12 . . . emitter region, 14 . . . base region, 15 . . . contact region, 16 . . . accumulation region, 18 . . . drift region, 20 . . . buffer region, 21 . . . upper surface, 22 . . . collector region, 23 . . . lower surface, 24 . . . collector electrode, 29 . . . linear part, 30 . . . dummy trench portion, 31 . . . distal end portion, 32 . . . dummy dielectric film, 34 . . . dummy conductive portion, 38 . . . interlayer dielectric film, 39 . . . linear part, 40 . . . gate trench portion, 41 . . . distal end portion, 42 . . . gate dielectric film, 44 . . . gate conductive portion, 52 . . . emitter electrode, 54 . . . contact hole, 60, 61 . . . mesa portion, 70 . . . transistor portion, 80 . . . diode portion, 81 . . . extended region, 82 . . . cathode region, 90 . . . edge terminal structure portion, 92 . . . guard ring, 93 . . . side surface, 94 . . . field plate, 95 . . . gap, 97 . . . recess portion, 98 . . . opening, 100 . . . semiconductor device, 102 . . . end side, 112 . . . gate pad, 130 . . . outer peripheral gate runner, 131 . . . active-side gate runner, 140 . . . protective film, 160 . . . active portion, 174 . . . channel stopper, 202, 203 . . . high concentration region, 204 . . . region, 206, 207 . . . upper part, 208, 211 . . . lower part, 209 . . . region, 221, 241 . . . upper end, 260 . . . lower region, 261 . . . lower region, 262 . . . equipotential line

What is claimed is:

1. A semiconductor device comprising:
    a semiconductor substrate having a drift region of a first conductivity type;
    an active region provided in the semiconductor substrate;
    an edge terminal structure portion provided in the semiconductor substrate, and provided between the active region and an end portion of the semiconductor substrate on an upper surface of the semiconductor substrate;
    an emitter electrode formed on the upper surface of the semiconductor substrate in the active region; and
    a well region of a second conductivity type that is formed between the active region and the edge terminal structure, the well region being in contact with the emitter electrode, wherein:
    the edge terminal structure portion has
    a plurality of guard rings of a second conductivity type which are in contact with the upper surface of the semiconductor substrate, and
    a high concentration region of the first conductivity type which is provided, between adjacent two of the guard rings, from a position on an upper surface side relative to lower ends of the guard rings to a position on a lower surface side relative to the lower ends of the guard rings, the high concentration region having a higher doping concentration than the drift region; and
    each of the guard rings has a region that is not covered by the high concentration region as viewed from a lower surface side of the semiconductor substrate.

2. The semiconductor device according to claim 1, wherein
    at least a part of a lower surface of each of the guard rings is in contact with the drift region.

3. The semiconductor device according to claim 1, wherein
    the high concentration region is in contact with the upper surface of the semiconductor substrate.

4. The semiconductor device according to claim 1, wherein
    an upper end of the high concentration region is arranged to be lower than an upper end of the guard rings that are adjacent to each other.

5. The semiconductor device according to claim 4, wherein
    the guard ring is in contact with the upper surface of the semiconductor substrate; and the upper end of the high concentration region is arranged to be lower than the upper surface of the semiconductor substrate.

6. The semiconductor device according to claim 5, further comprising:
an interlayer dielectric film that covers the high concentration region.

7. The semiconductor device according to claim 1, further comprising:
a base region of the second conductivity type on the upper surface of the semiconductor substrate in the active region;
a contact region of the second conductivity type that is shallower and has a higher doping concentration than the base region; and
an emitter region of the first conductivity type that is shallower and has a higher doping concentration than the base region;
wherein the base region, the emitter region, or the contact region is in contact with the emitter electrode.

8. A semiconductor device comprising:
a semiconductor substrate having a drift region of a first conductivity type;
an active region provided in the semiconductor substrate; and
an edge terminal structure portion provided in the semiconductor substrate, and provided between the active region and an end portion of the semiconductor substrate on an upper surface of the semiconductor substrate, wherein:
the edge terminal structure portion has
a plurality of guard rings of a second conductivity type which are in contact with the upper surface of the semiconductor substrate, and
a high concentration region of the first conductivity type which is provided, between adjacent two of the guard rings, from a position on an upper surface side relative to lower ends of the guard rings to a position on a lower surface side relative to the lower ends of the guard rings, the high concentration region having a higher doping concentration than the drift region;
each of the guard rings has a region that is not covered by the high concentration region as viewed from a lower surface side of the semiconductor substrate; and
the high concentration region has
an upper part in contact with the upper surface of the semiconductor substrate, and
a lower part that is provided as a separate part from the upper part, and is provided from the position shallower than the lower ends of the guard rings to the position deeper than the lower ends of the guard rings.

9. The semiconductor device according to claim 8, wherein:
the upper part contains a first dopant of the first conductivity type; and
the lower part contains a second dopant of the first conductivity type which is made of an element different from the first dopant.

10. The semiconductor device according to claim 9, wherein
the second dopant is hydrogen.

11. The semiconductor device according to claim 8, wherein:
the active region has
a base region of the second conductivity type, and
a well region of the second conductivity type which has a higher doping concentration than the base region, and is also provided from the upper surface of the semiconductor substrate to a position deeper than the base region; and
a doping concentration of the lower part is lower than the doping concentration of the well region.

12. The semiconductor device according to claim 11, wherein
a lower end of the lower part is arranged in a position shallower than a lower end of the well region.

13. A semiconductor device comprising:
a semiconductor substrate having a drift region of a first conductivity type;
an active region provided in the semiconductor substrate; and
an edge terminal structure portion provided in the semiconductor substrate, and provided between the active region and an end portion of the semiconductor substrate on an upper surface of the semiconductor substrate, wherein:
the edge terminal structure portion has
a plurality of guard rings of a second conductivity type which are in contact with the upper surface of the semiconductor substrate, and
a high concentration region of the first conductivity type which is provided, between adjacent two of the guard rings, from a position on an upper surface side relative to lower ends of the guard rings to a position on a lower surface side relative to the lower ends of the guard rings, the high concentration region having a higher doping concentration than the drift region;
each of the guard rings has a region that is not covered by the high concentration region as viewed from a lower surface side of the semiconductor substrate; and
at least a part of a lower surface of each of the guard rings is in contact with the drift region.

14. The semiconductor device according to claim 13, wherein
the high concentration region is in contact with the upper surface of the semiconductor substrate.

15. The semiconductor device according to claim 13, wherein
an upper end of the high concentration region is arranged to be lower than an upper end of the guard rings that are adjacent to each other.

16. The semiconductor device according to claim 15, wherein
the guard ring is in contact with the upper surface of the semiconductor substrate; and
the upper end of the high concentration region is arranged to be lower than the upper surface of the semiconductor substrate.

17. The semiconductor device according to claim 16, further comprising:
an interlayer dielectric film that covers the high concentration region.

* * * * *